(12) United States Patent
Lee et al.

(10) Patent No.: US 11,937,384 B2
(45) Date of Patent: Mar. 19, 2024

(54) ELECTRONIC DEVICE

(71) Applicant: Samsung Display Co., Ltd., Yongin-si (KR)

(72) Inventors: Jonghwa Lee, Hwaseong-si (KR); Beomjin Kim, Anyang-si (KR); Dongwon Choi, Seoul (KR); Jin Hwan Choi, Seoul (KR); Taewoong Kim, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 128 days.

(21) Appl. No.: 17/680,291

(22) Filed: Feb. 25, 2022

(65) Prior Publication Data

US 2022/0279667 A1 Sep. 1, 2022

(30) Foreign Application Priority Data

Feb. 26, 2021 (KR) ........................ 10-2021-0026649

(51) Int. Cl.
*G06F 1/16* (2006.01)
*G09F 9/35* (2006.01)
(Continued)

(52) U.S. Cl.
CPC ......... *H05K 5/0017* (2013.01); *G06F 1/1624* (2013.01); *G06F 1/1681* (2013.01); *H05K 5/0226* (2013.01); *H05K 7/1427* (2013.01)

(58) Field of Classification Search
CPC ...... H05K 5/0017; H05K 5/0226; G06F 1/16; G06F 1/169; G06F 1/1601; G06F 1/1624; G06F 1/1626; G06F 1/1637; G06F 1/1647; G06F 1/1652; G06F 1/1656; G06F 1/1658; G06F 1/1669; G06F 1/1681; G09F 9/29; G09F 9/35; G09F 9/301; H04M 1/0237; H04M 1/0268
(Continued)

(56) References Cited

U.S. PATENT DOCUMENTS 9,547,340 B2 1/2017 Min et al.
9,940,892 B2 4/2018 Pang
(Continued)

FOREIGN PATENT DOCUMENTS

KR 10-2017-0006089 1/2017
KR 10-2017-0081345 7/2017
(Continued)

*Primary Examiner* — Xiaoliang Chen
(74) *Attorney, Agent, or Firm* — H.C. Park & Associates, PLC

(57) ABSTRACT

An electronic device includes a display module including a display unit and a hinge unit coupled to the display unit and configured to be rolled with the display unit, the display unit including a display panel, a flexible circuit board connected to the display panel, and a main circuit board connected to the flexible circuit board, a housing including sidewall portions each extending in a first direction, in which at least one of the sidewall portions includes an accommodation groove to which the main circuit board is inserted, and the sidewall portions are deformable between a closed state of surrounding the display module and an opened state of exposing at least a portion of the display module outside of the housing.

13 Claims, 24 Drawing Sheets

(51) Int. Cl.
*H05K 5/00*   (2006.01)
*H05K 5/02*   (2006.01)
*H05K 7/14*   (2006.01)

(58) Field of Classification Search
USPC .................. 361/807; 40/515, 735; 349/58
See application file for complete search history.

(56) References Cited

U.S. PATENT DOCUMENTS

| | | |
|---|---|---|
| 10,362,690 B2 | 7/2019 | Han |
| 10,537,026 B2 | 1/2020 | Shin et al. |
| 10,547,718 B2 | 1/2020 | Lee |
| 2006/0007368 A1* | 1/2006 | Slikkerveer ............ G09F 9/301 |
| | | 349/58 |
| 2006/0107566 A1* | 5/2006 | Van Rens ............ G06F 1/1652 |
| | | 40/515 |
| 2006/0288622 A1* | 12/2006 | Guard ................ G11B 33/0472 |
| 2019/0138058 A1* | 5/2019 | Kwon ...................... G09G 3/22 |
| 2020/0365063 A1* | 11/2020 | Park ....................... H10K 50/84 |
| 2021/0352813 A1* | 11/2021 | Cho ..................... G06F 1/1658 |
| 2022/0326735 A1* | 10/2022 | Kang ................... G06F 1/1684 |

FOREIGN PATENT DOCUMENTS

| | | |
|---|---|---|
| KR | 10-2017-0095636 | 8/2017 |
| KR | 10-2162566 | 10/2020 |

\* cited by examiner

ELECTRONIC DEVICE

CROSS-REFERENCE TO RELATED APPLICATIONS

This application claims priority from and the benefit of Korean Patent Application No. 10-2021-0026649, filed on Feb. 26, 2021, which is hereby incorporated by reference for all purposes as if fully set forth herein.

BACKGROUND

Field

Embodiments of the invention relate generally to an electronic device and more particularly, to a rollable electronic device including a housing that is deformable to have a closed state and an opened state.

Discussion of the Background

In recent years, a bendable or foldable electronic device has been developed, and a foldable electronic device or a rollable electronic device using a flexible display panel has been developed. A display module of the rollable electronic device may be coupled to a hinge unit and rolled and accommodated in a housing in a rolled state.

The above information disclosed in this Background section is only for understanding of the background of the inventive concepts, and, therefore, it may contain information that does not constitute prior art.

SUMMARY

Electronic devices including a display module and a housing constructed according to the principles of the invention are capable of reducing or minimizing a separate space for arranging a driving portion of the display module in the housing by arranging the driving portion connected to a display panel of the display module in an inner groove of the housing. Thus, the electronic devices have improved portability and usability.

Additional features of the inventive concepts will be set forth in the description which follows, and in part will be apparent from the description, or may be learned by practice of the inventive concepts.

According to an aspect of the invention, an electronic device including: a display module including a display unit and a hinge unit coupled to the display unit and configured to be rolled with the display unit, the display unit including a display panel, a flexible circuit board connected to the display panel, and a main circuit board connected to the flexible circuit board; and a housing including sidewall portions each extending in a first direction, in which at least one of the sidewall portions includes an accommodation groove to which the main circuit board is inserted, and the sidewall portions are deformable to have a closed state of surrounding the display module and an opened state of exposing at least a portion of the display module outside of the housing.

The electronic device may further include: a main board connected to the main circuit board; a power supply module connected to the main circuit board; and lines for connecting the main circuit board to the main board and for connecting the main board to the power supply module, and at least one of the main board and the power supply module may be inserted to the accommodation groove of the sidewall portions.

The sidewall portions may include first, second, third, and fourth sidewall portions arranged in a second direction intersecting the first direction in the opened state, the housing may include: a first connection portion disposed between the first sidewall portion and the second sidewall portion; a second connection portion disposed between the second sidewall portion and the third sidewall portion; and a third connection portion disposed between the third sidewall portion and the fourth sidewall portion, and each of the first connection portion and the second connection portion may include a line groove through which a corresponding line of the lines passes.

The display module may be rolled in the second direction, the first, second, third, and fourth sidewall portions may be deformed from the closed state to the opened state in the second direction, and one portion of the first sidewall portion may contact one portion of the fourth sidewall portion in the closed state.

The third connection portion may maintain an angle between the third sidewall portion and the fourth sidewall portion at a predetermined angle in a range from about 90° to about 180°.

At least one of the second, third, and fourth sidewall portions may include a base portion and a holding portion, which are arranged in the first direction by using a first bending line extending in the second direction as a boundary, and the holding portion may be bent along the first bending line so that an angle with the base portion is maintained at a predetermined angle in a range from about 90° to about 180°.

Each of the second, third, and fourth sidewall portions may further include an additional sidewall portion inserted into the accommodation groove in a first mode and slid outside of the housing in a second mode, and the additional sidewall portion may be bent from the holding portion by using a second bending line spaced apart from the first bending line in the first direction and extending in the second direction as a boundary.

One of the sidewall portions may include a central portion protruding from the one of the sidewall portions and extending in the first direction, the central portion including a line groove through which a corresponding line of the lines passes, and another of the sidewall portions may include coupling portions protruding from the another of the sidewall portions and spaced apart from each other in the first direction with the central portion therebetween, the coupling portions being coupled to the central portion.

The line groove may be provided in plurality and spaced apart from each other in the first direction.

The flexible circuit board may be bent with the hinge unit therebetween, and the display panel and the main circuit board may be spaced apart from each other with the hinge unit therebetween.

The hinge unit may include: extension portions each extending in the first direction and arranged in a second direction crossing the first direction; and joint portions each disposed between two adjacent extension portions, and the extension portions may have widths that gradually decrease in a direction away from the flexible circuit board in the second direction.

The hinge unit may further include: a support portion connected to an extension portion, which is closest to the flexible circuit board among the extension portions, through the joint portion; and a cover portion coupled to the support portion to cover a portion of each of the display panel and the flexible circuit board, and the flexible circuit board may be bent with the support portion therebetween.

Among the extension portions, a n-th extension portion and a (n+8)-th extension portion (where, the 'n' is a natural number equal to or greater than 1) may overlap each other in a state in which the display module is rolled.

According to another aspect of the invention, an electronic device includes: a display module and a hinge unit coupled to the display unit and configured to be rolled with display unit, the display unit including a display unit including a display panel, a flexible circuit board connected to the display panel, and a main circuit board connected to the flexible circuit board; a main board connected to the main circuit board; a power supply module connected to the main circuit board; and a housing including sidewall portions, in which at least one of the sidewall portions includes an accommodation groove defined as an inner space, and each of the main circuit board, the main board, and the power supply module is inserted to a corresponding accommodation groove of the accommodation grooves of the sidewall portions.

The sidewall portions may be deformable to have a closed state of surrounding the display module and an opened state of exposing at least a portion of the display module outside of the housing.

The electronic device may further include lines for connecting the main circuit board to the main board and for connecting the main board to the power supply module, the sidewall portions may include first, second, third, and fourth sidewall portions each extending in a first direction and arranged in a second direction crossing the first direction, and the housing may include: a first connection portion disposed between the first sidewall portion and the second sidewall portion; a second connection portion disposed between the second sidewall portion and the third sidewall portion; and a third connection portion disposed between the third sidewall portion and the fourth sidewall portion. Each of the first connection portion and the second connection portion may include a line groove through which a corresponding line of the lines passes.

The display module may be rolled in the second direction, the first, second, third, and fourth sidewall portions may be deformed from the closed state to the opened state in the second direction, and one portion of the first sidewall portion may contact one portion of the fourth sidewall portion in the closed state.

One of the sidewall portions may include a central portion protruding from the one of the sidewall portions and extending in the first direction, the central portion including a line groove through which a corresponding line of the lines passes, and another of the sidewall portions may include coupling portions protruding from the another of the sidewall portions and spaced apart from each other in the first direction with the central portion therebetween, the coupling portions being coupled to the central portion.

The line groove may be provided in plurality and spaced apart from each other in the first direction.

The hinge unit may include: extension portions each extending in the first direction and arranged in a second direction crossing the first direction; and joint portions each disposed between two adjacent extension portions, and the extension portions may have widths that gradually decrease in a direction away from the flexible circuit board in the second direction.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1A:
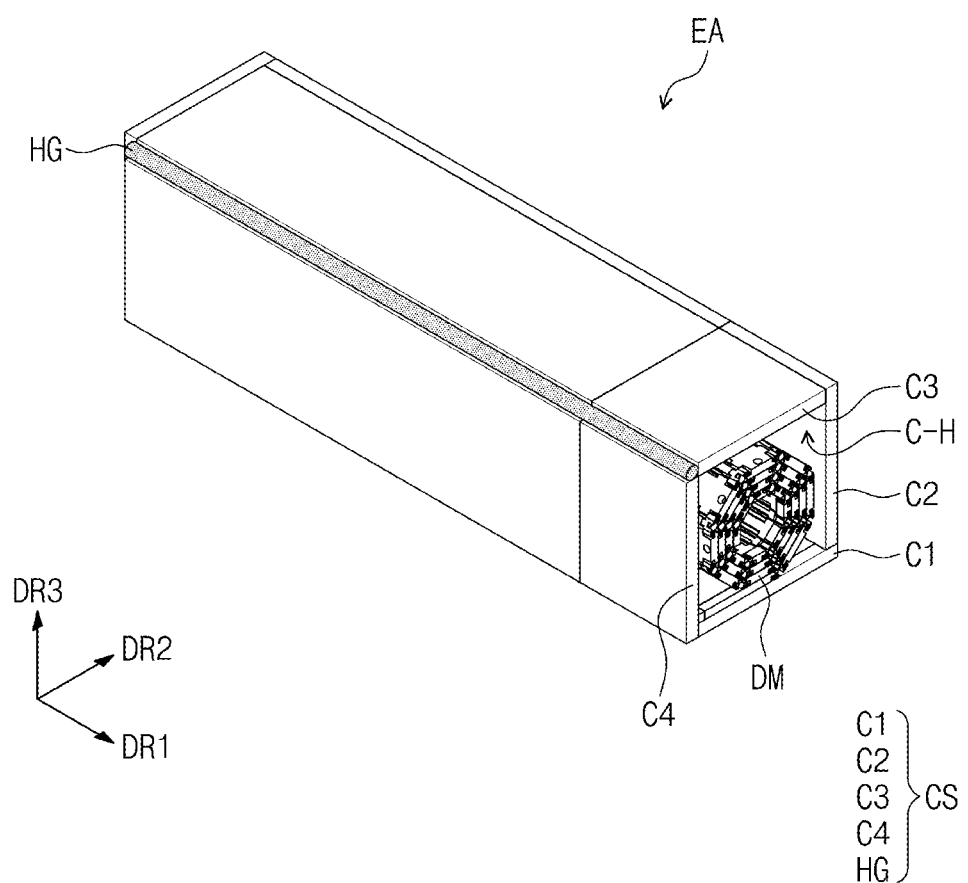
FIG. 1A is a perspective view of an embodiment of an electronic device constructed according to the principles of the invention illustrated in a closed state thereof.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
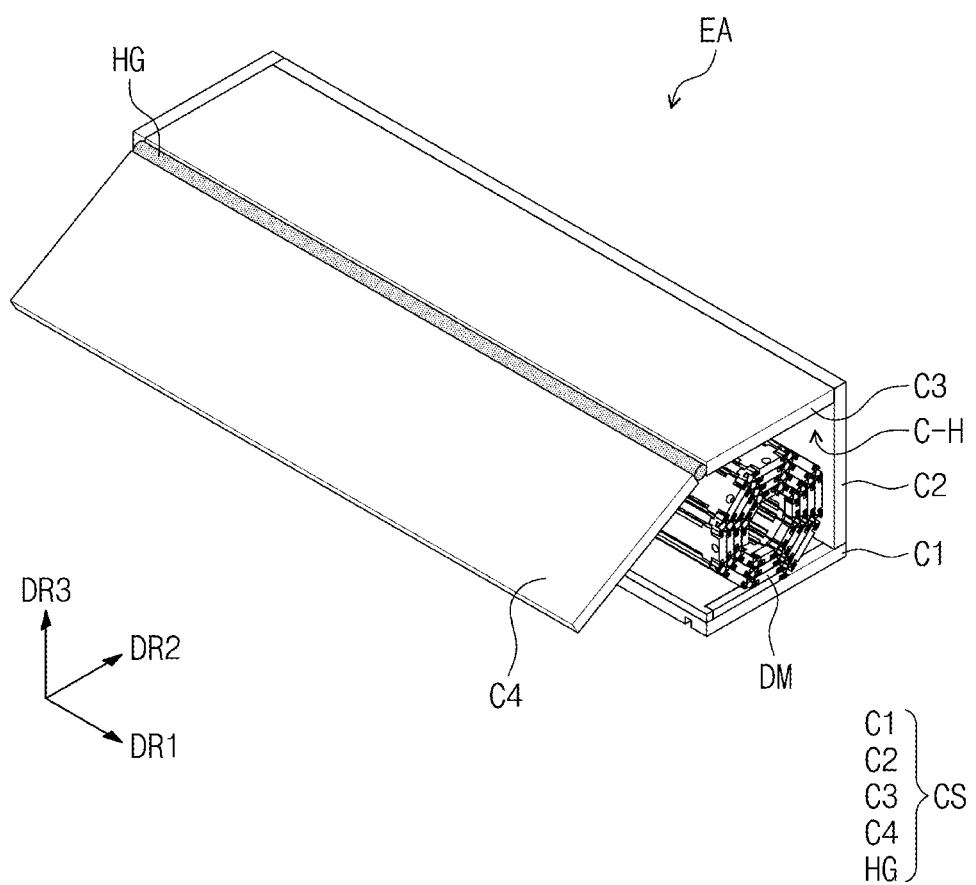
FIG. 1B is a perspective view illustrating a transition state of the electronic device of FIG. 1A.
Figure 1C:
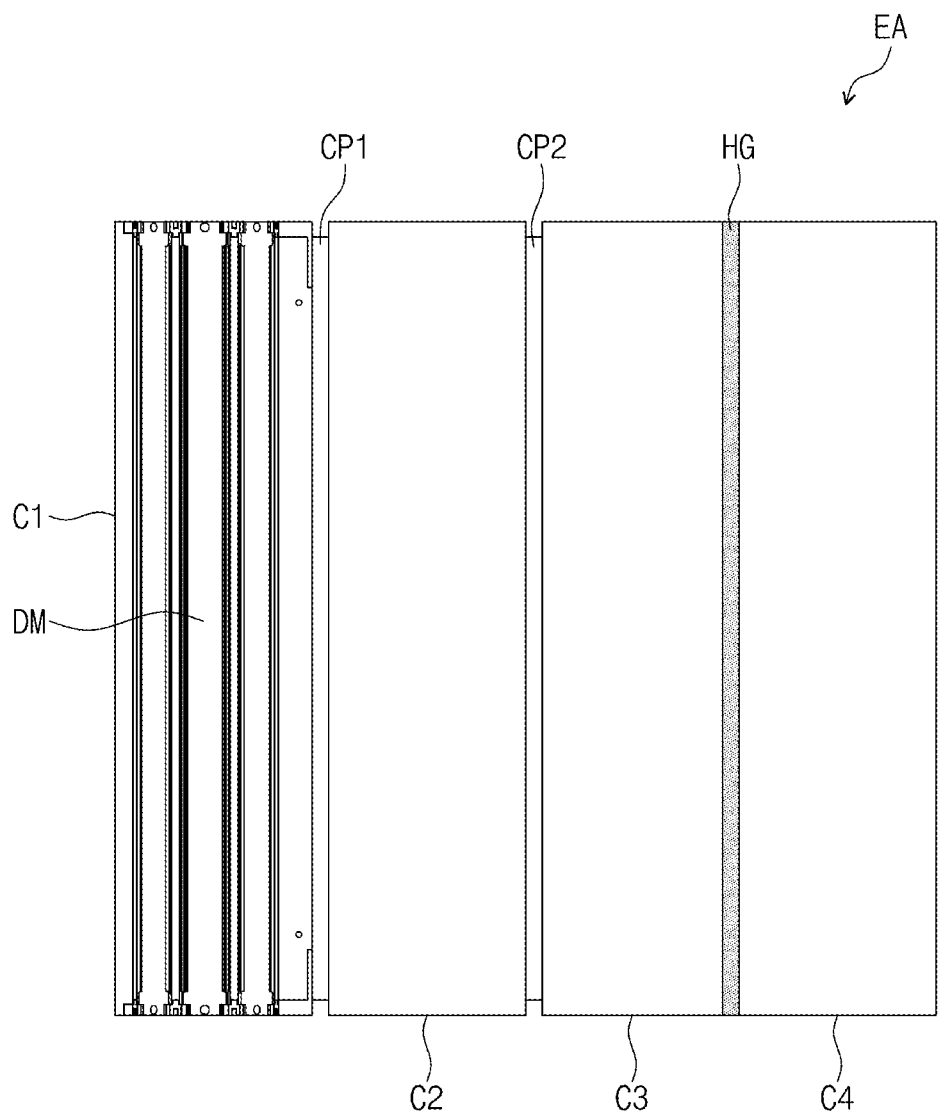
FIG. 1C is a perspective view illustrating an opened state of the electronic device of FIG. 1A.
Figure 2A:
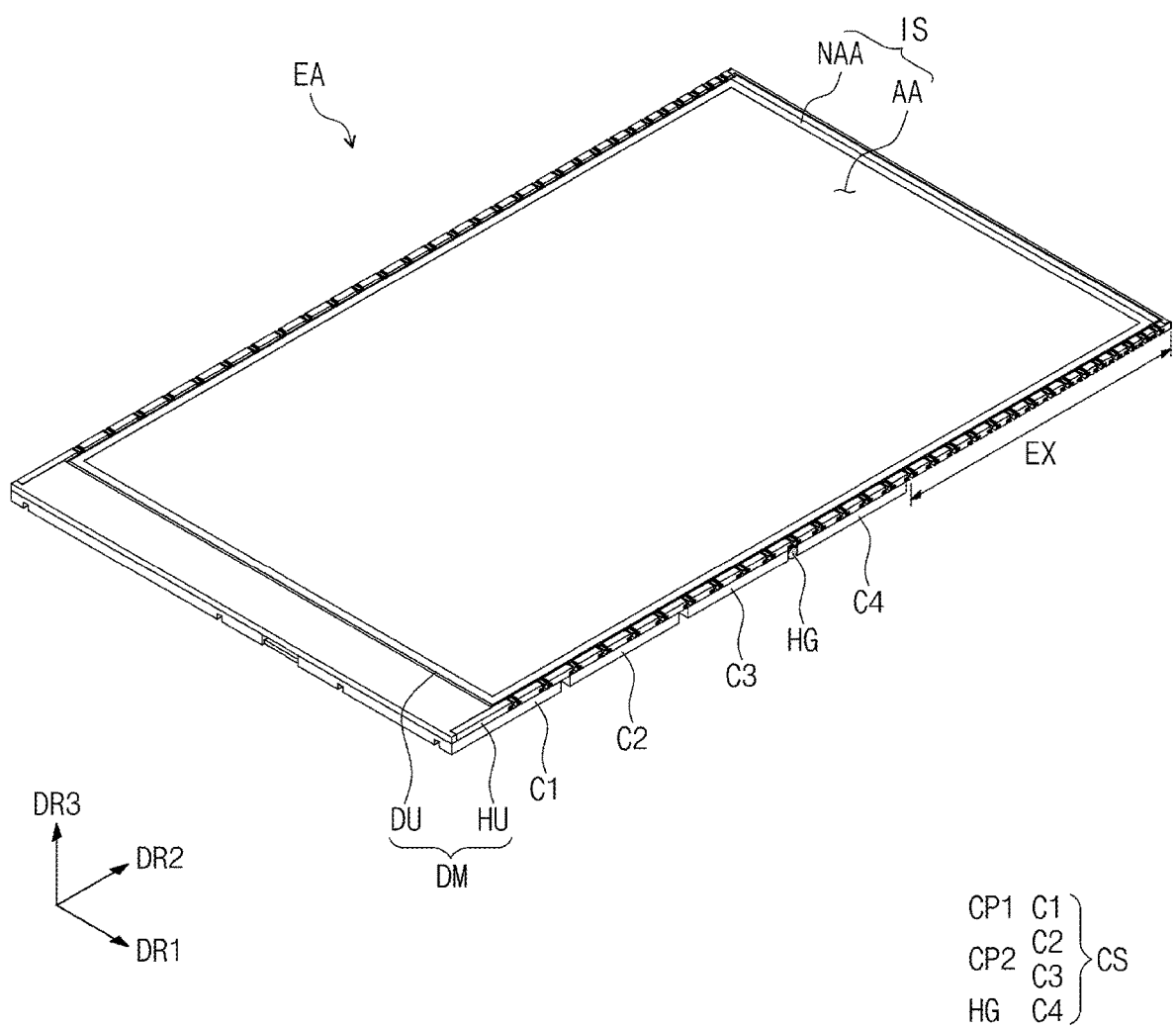
FIGS. 2A and 2B are perspective views of the electronic device of FIG. 1C illustrating a display module of the electronic device in an unfolded state.
Figure 2B:
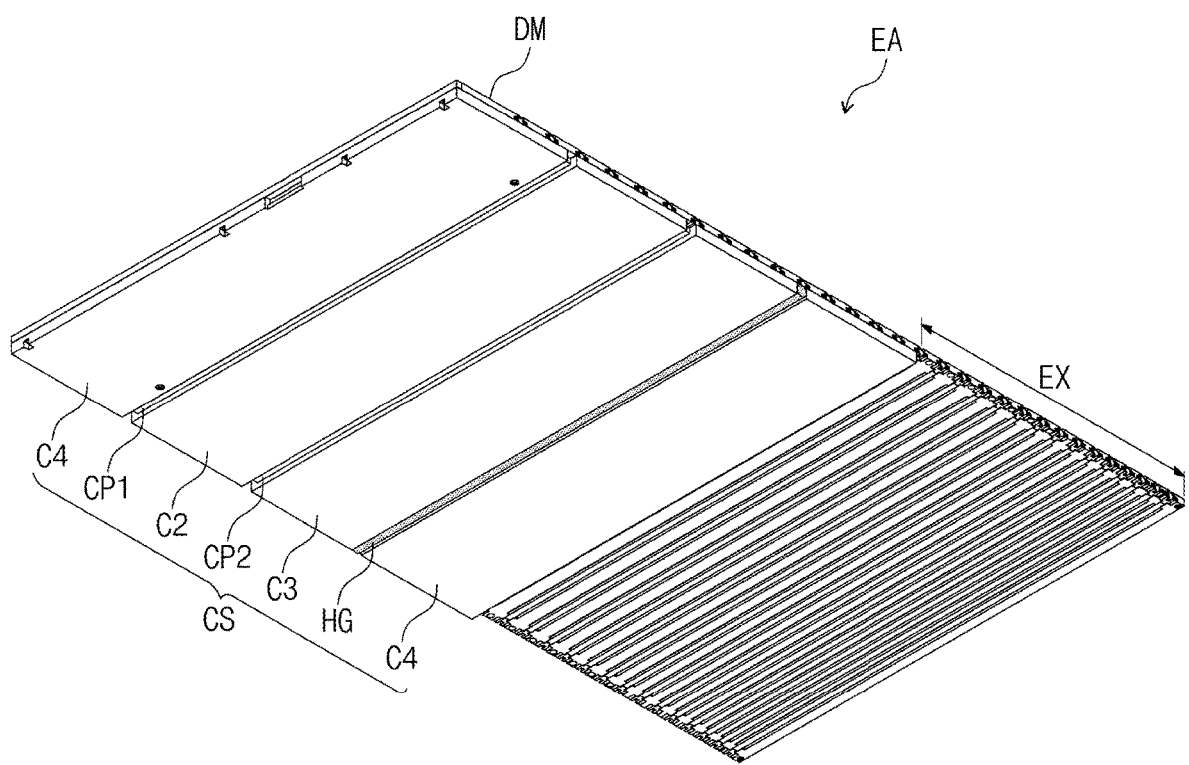
Figure 2B:
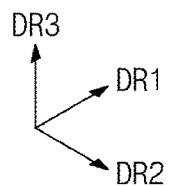

FIG. 1A is a perspective view illustrating an electronic device in one state according to an embodiment of the inventive concepts. FIG. 1B is a perspective view illustrating the electronic device in one state according to an embodiment. FIG. 1C is a perspective view illustrating the electronic device in one state according to an embodiment. FIGS. 2A and 2B are perspective views illustrating a display module in an unrolled state according to an embodiment.

Referring to FIGS. 1A and 1B, an electronic device EA according to an embodiment may include a rollable display module DM and a housing CS.

The housing CS according to an embodiment may be converted into various states according to purposes of a user. For example, the housing CS in FIG. 1A illustrates a closed state, and the housing CS in FIG. 1C illustrates an opened state. The housing CS in FIG. 1B illustrates one state that is being deformed from the closed state to the opened state.

The housing CS may include a plurality of sidewall portions C1, C2, C3, and C4 and connection portions CP1, CP2, and HG. Each of the sidewall portions C1, C2, C3, and C4 may extend in a first direction DR1. The sidewall portions C1, C2, C3, and C4 may be coupled to each other or spaced apart from each other.

For example, in the opened state, a first sidewall portion C1, a second sidewall portion C2, a third sidewall portion C3, and a fourth sidewall portion C4 may be arranged in a second direction DR2. For example, the first sidewall portion C1 may be connected to the second sidewall portion C2 through a first connection portion CP1, the second sidewall portion C2 may be connected to the third sidewall portion C3 through a second connection portion CP2, and the third sidewall portion C3 may be connected to the fourth sidewall portion C4 through a third connection portion HG.

In the closed state, as one portion of the first sidewall portion C1 is coupled to at least one portion of the fourth sidewall portion C4, the sidewall portions C1, C2, C3, and C4 may surround the rolled display module DM. The coupling method may include a coupling method of using a magnetic force or a coupling method of using a separate coupling portion. However, embodiments are not limited thereto. When the housing CS is in the closed state, the sidewall portions C1, C2, C3, and C4 may provide an inner space C-H capable of accommodating the display module DM.

The connection portions CP1, CP2, and HG may each extend in the first direction DR1, and be disposed between corresponding sidewall portions C1, C2, C3, and C4 and spaced apart from each other in the second direction DR2.

The connection portions CP1, CP2, and HG may include the first connection portion CP1 disposed between the first sidewall portion C1 and the second sidewall portion C2, the second connection portion CP2 disposed between the second sidewall portion C2 and the third sidewall portion C3, and the third connection portion CP3 disposed between the third sidewall portion C3 and the fourth sidewall portion C4.

The connection portions CP1, CP2, and HG may be disposed between the corresponding sidewall portions C1, C2, C3, and C4 and bent while the sidewall portions C1, C2, C3, and C4 are deformed according to the closed state and the opened state.

According to an embodiment, in the closed state, the sidewall portions C1, C2, C3, and C4 may accommodate the display module DM and components for driving the display module DM therein, and protect components disposed therein.

The third connection portion HG may adjust a degree of opening and closing of the fourth sidewall portion C4 that is opened and closed from the first sidewall portion C1. For example, the third connection portion HG may variously adjust an angle between the fourth sidewall portion C4 and the third sidewall portion C3. Thus, the electronic device EA in which the fourth sidewall portion C4 is capable of holding the display module DM in the opened state may be provided. Descriptions related to this will be described later referring to FIGS. 8A and 8B.

Additional sidewall portions for covering a side surface of the display module may be further connected to one end and the other end of the first connection portion CP1, which are spaced apart from each other in the first direction DR1. The additional sidewall portions may be also opened and closed while the housing CS is deformed from the closed state to the opened state.

FIGS. 2A and 2B are views illustrating the electronic device EA in the opened state. FIG. 2A is a view illustrating a display surface DS of the display module DM in the opened state, and FIG. 2B is a view illustrating the housing CS in the opened state.

The rolled display module DM described in FIG. 1A may be unrolled in the second direction DR2 in a state in which the sidewall portions C1, C2, C3, and C4 of the housing CS are opened in the second direction DR2. Here, one portion of the unrolled display module DM may protrude from the sidewall portions C1, C2, C3, and C4 in the second direction DR2 and be exposed from the fourth sidewall portion C4 disposed at an outermost portion of the sidewall portions C1, C2, C3, and C4.

The display module DM may be coupled to the housing even in a state of being coupled to the first sidewall portion C1 so as to be rolled or unrolled. The rest portions except for a portion overlapping the first sidewall portion CP1 in the display module DM may be spaced apart from the second, third, and fourth sidewall portions C2, C3, and C4 when rolled and contact the second, third, and fourth sidewall portions C2, C3, and C4 when unrolled.

The display module DM may include a display unit DU and a hinge unit HU. The display unit DU may include a display surface IS for displaying an image. The display surface IS may be a front surface of the display module DM in the unrolled state. The image displayed to a user by the display unit DU may include a static image as well as a dynamic image.

The front surface IS may include an active area AA and a peripheral area NAA disposed adjacent to the active area AA. The active area AA may be defined as an area for displaying an image and defined as an area for disposing lines and driving elements necessary for driving the display unit DU. The peripheral area NAA may have a predetermined color and surround the active area AA.

The active area AA may sense an external input applied from the outside. The external input may include various types of inputs provided from the outside of the electronic device EA.

For example, the external input may include contact or touch that is generated by a portion of a user's body such as hands. For example, the external input may include hovering that is applied by an object disposed adjacent to the electronic device EA or by an object disposed adjacent by a predetermined distance to the electronic device EA. Also, the external input may have various types such as a force, a pressure, a temperature, and light.

The hinge unit HU may be disposed below the display unit DU to support the display unit DU. The hinge unit HU may include a plurality of joints and be substantially rolled as coupled to the display unit DU. Coupling of the first sidewall portion C1 with the display module DM may be performed such that the hinge unit HU overlapping the first sidewall portion C1 among the hinge units HU is coupled to the display module DM.

Figure 3A:
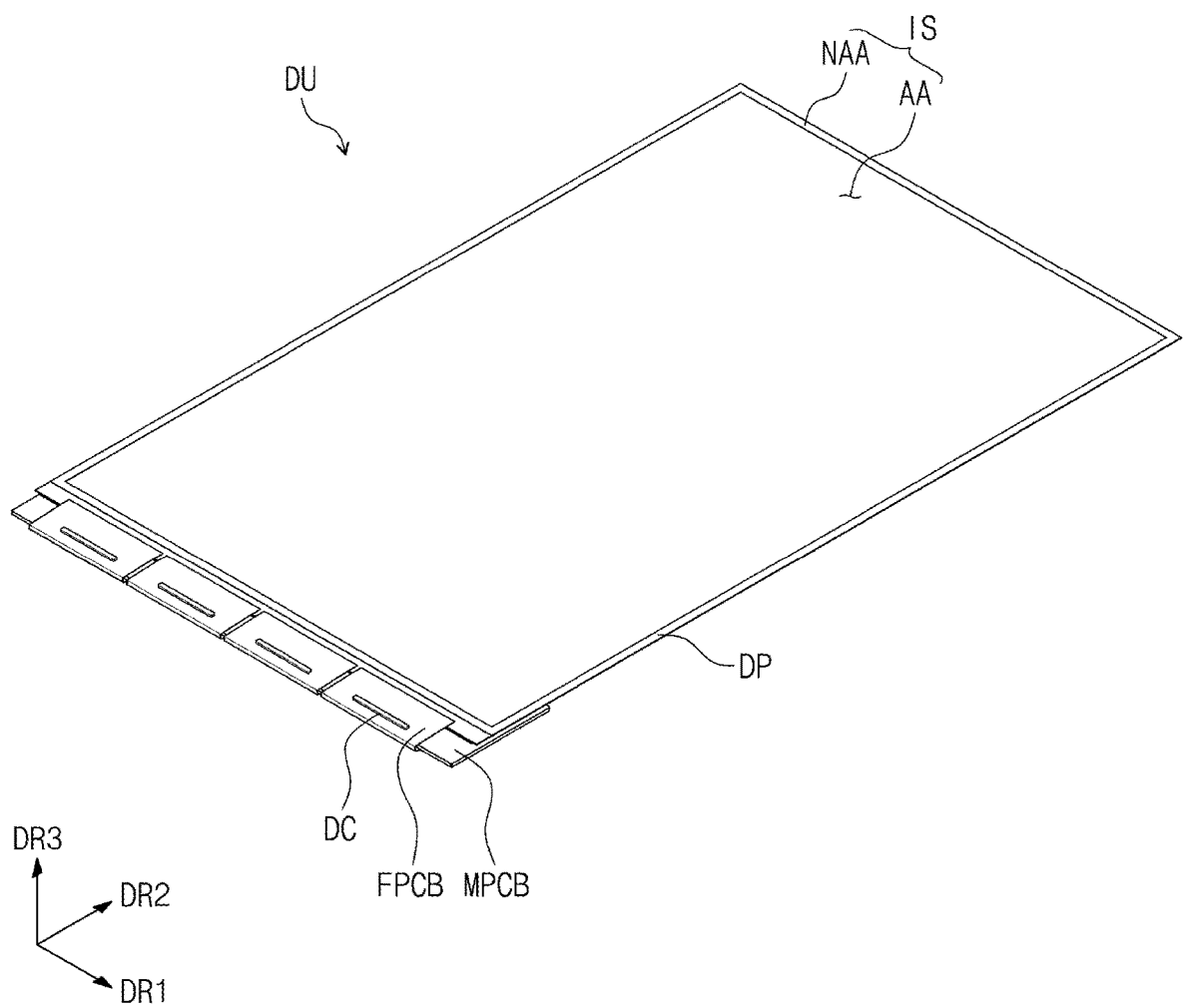
FIGS. 3A and 3B are perspective views of a display unit of the display module of FIGS. 2A and 2B illustrating an unrolled state of the display unit.
Figure 3B:
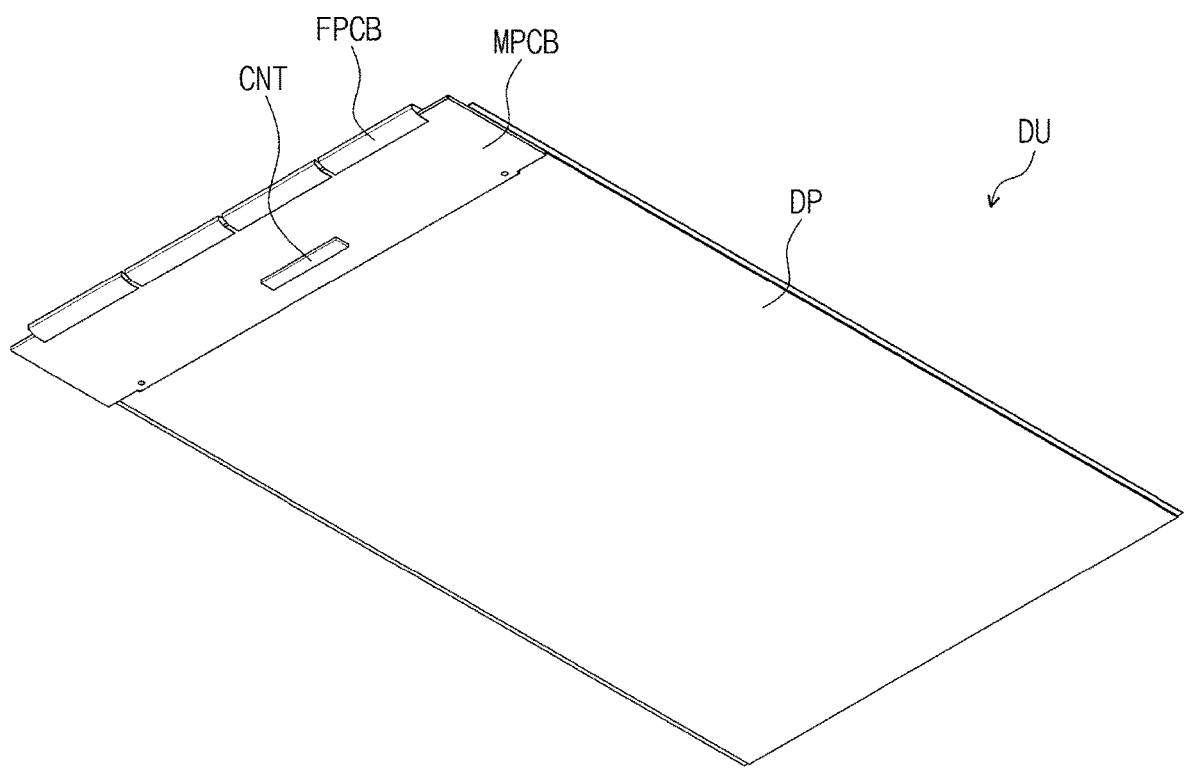
Figure 4A:
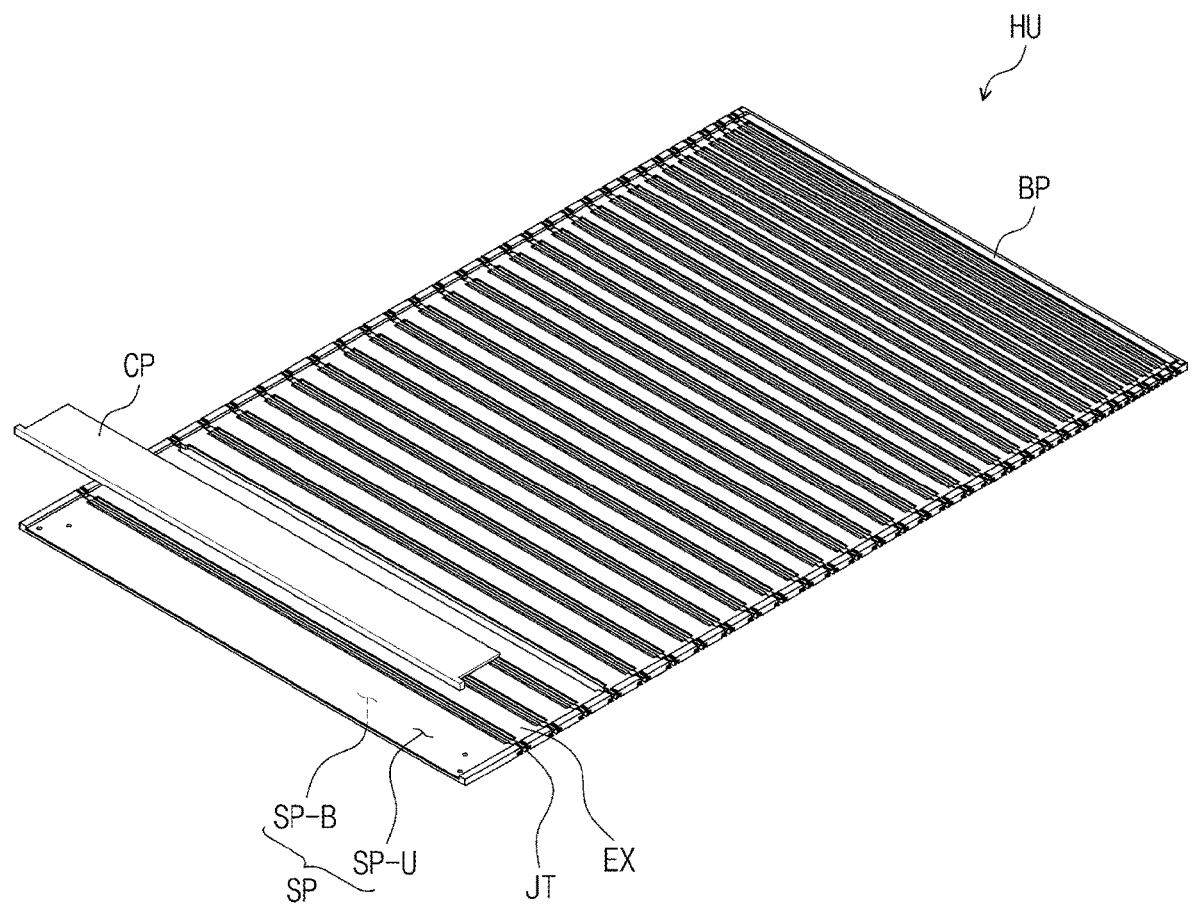
FIG. 4A is an exploded perspective view of a hinge unit of the display module of 2A and 2B illustrating an unrolled state of the hinge unit.
Figure 4B:
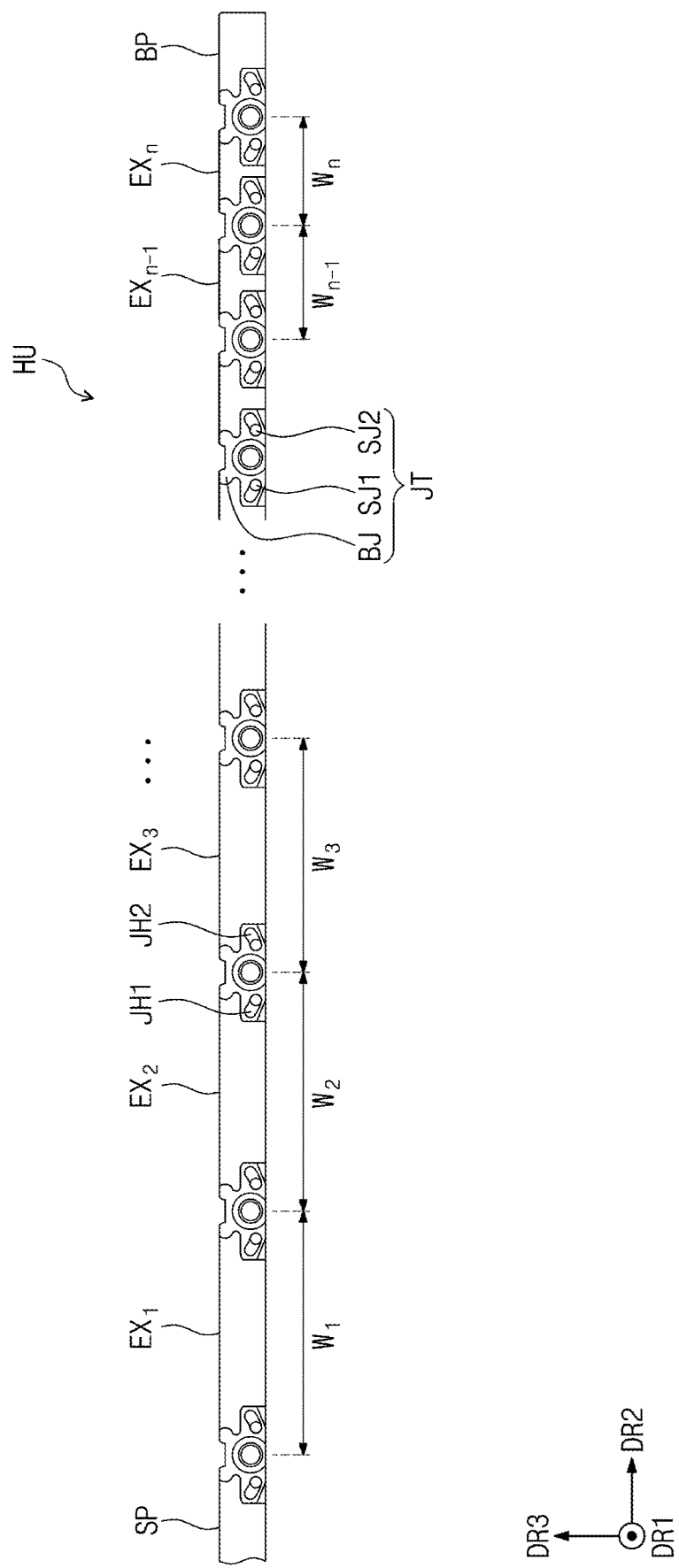
FIG. 4B is a side view of a portion of the hinge unit of FIG. 4A.
Figure 4C:
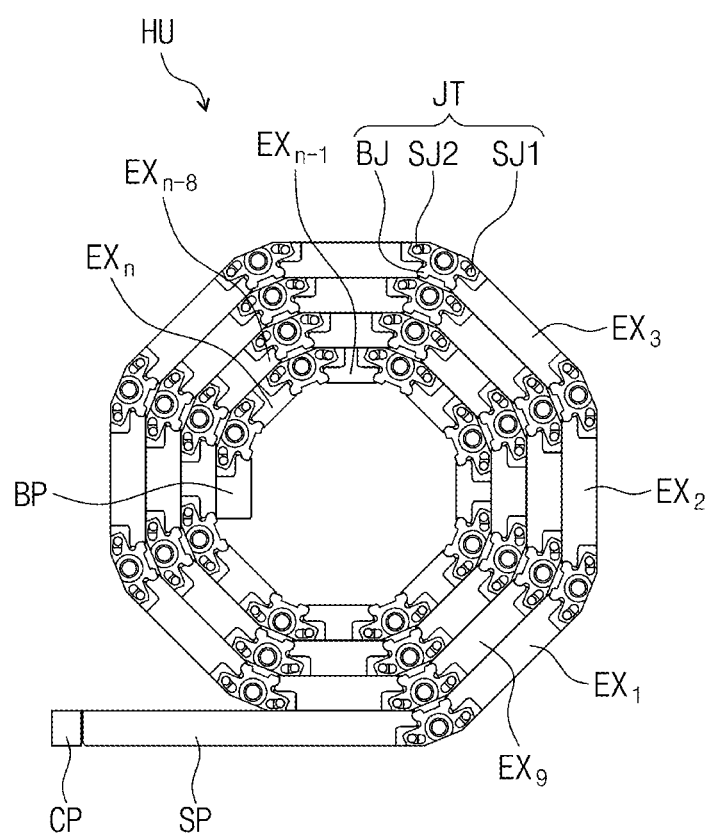
FIG. 4C is a side view of the hinge unit of FIG. 4A illustrating a rolled state of the hinge unit.

FIGS. 3A and 3B are perspective views illustrating the display unit in the unrolled state according to an embodiment. FIG. 4A is an exploded perspective view illustrating the hinge unit in the unrolled state according to an embodiment. FIG. 4B is a side view illustrating a portion of the hinge unit according to an embodiment. FIG. 4C is a side view illustrating the hinge unit in the rolled state according to an embodiment.

Referring to FIGS. 3A and 3B, the display unit DU according to an embodiment may include a display panel DP, a main circuit board MPCB, a flexible circuit board FPCB, and a driving chip DC.

The display panel DP may include a plurality of pixels. The pixels may generate light to display an image on the display surface IS. The display panel DP may include a gradation display layer for generating light. The gradation display layer may include various embodiments according to the kind of the display panel DP. For example, the display panel DP may be one of a liquid crystal display panel, an electrophoretic display panel, a microelectromechanical system (MEMS) display panel, an electrowetting display panel, an organic light emitting display panel, and an inorganic light emitting display panel. However, embodiments are not limited thereto.

The flexible circuit board FPCB may electrically connect the display panel DP and the main circuit board MPCB. The flexible circuit board FPCB may include flexible pads that are one-to-one connected to display pads of the display panel DP. Also, the flexible circuit board FPCB may include flexible pads that are one-to-one connected to main pads of the main circuit board MPCB.

The flexible circuit board FPCB may be provided in plurality to be spaced apart from each other in the second direction DR2. As one area of each of the flexible circuit boards is bent, the main circuit board MPCB may be disposed on a rear surface of the display panel DP.

The flexible circuit board FPCB may include the driving chip DC. The driving chip DC may receive a signal from the main circuit board MPCB, and the display panel DP may receive a signal from the driving chip DC. In this embodiment, each of the driving chips DC may be a data driving circuit. In an embodiment, the flexible circuit board FPCB may transmit a signal provided from a signal control unit SC to the display panel DP.

The main circuit board MPCB may include a connector CNT. The main circuit board MPCB may be connected to a main board through the connector CNT when disposed on the rear surface of the display panel DP by the flexible circuit board FPCB.

A signal control unit may be mounted to the main circuit board MPCB. The signal control unit may receive image data and control signals from an external graphic control unit and transmit the received control signals to the display panel DP.

Referring to FIGS. 4A and 4B, the hinge unit HU may include a support portion SP, a cover portion CP, extension portions EX, joint portions JT, and an additional support portion BP.

The support portion SP may be connected to the extension portion EX, which is closest to the flexible circuit board FPCB among the extension portions EX, through the joint portion disposed between the extension portion EX and the support portion SP. The support portion SP may include a first surface SP-U and a second surface SP-B.

One portion of the flexible circuit board FPCB and one portion of the display panel DP, which is connected to the flexible circuit board FPCB, may be seated on the first surface SP-U.

As the flexible circuit board FPCB is bent with the support portion SP therebetween, the main circuit board MPCB may be disposed on the rear surface of the display panel DP. Thus, the rest portion of the flexible circuit board FPCB may be disposed on the second surface SP-B.

The cover portion CP may cover the one portion of the display panel DP and the one portion of the flexible circuit board FPCB, which are disposed on the support portion SP. Thus, moisture and foreign substances may be prevented from being introduced to the flexible circuit board FPCB.

The additional support portion BP may be connected to the extension portion EX, which is farthest from the flexible circuit board FPCB among the extension portions EX, through the joint portion disposed between the extension portion EX and the additional support portion BP. As the additional support portion BP fixes the display unit DU with the support portion SP, the display unit DU may be stably coupled on the hinge unit HU so as to be rolled or unrolled.

The extension portions EX may each extend in the first direction DR1 and be spaced apart from each other in the second direction DR2. The extension portions EX may include a first extension portion EX1, a second extension portion EX2, a third extension portion EX3, . . . , a (n−1)-th extension portion EXn−1, and a n-th extension portion EXn. The extension portions EX may be disposed below the display unit DU to protect the display unit DU.

The extension portions EX may each extend in the first direction DR1 and be spaced apart from each other in the second direction DR2. The joint portions JT may be disposed between two adjacent extension portions EX to easily adjust an angle between the extension portions EX.

Each of the joint portions JT may include a body portion BJ and fixing pins SJ1 and SJ2. In the body portion BJ, grooves JH1 and JH2, to which the fixing pins SJ1 and SJ2 are inserted, may be defined.

In each of the extension portions EX, grooves each overlapping the corresponding groove of the grooves JH1 and JH2 may be defined, and the fixing pins SJ1 and SJ2 may be coupled to the grooves JH1 and JH2 of the body portion BJ and the grooves of the extension portions EX and connect two adjacent extension portions EX with the body portion BJ therebetween.

Each of the grooves JH1 and JH2 of the body portion BJ may have an area greater than that of each of the fixing pins SJ1 and SJ2. Thus, although the fixing pins SJ1 and SJ2 couples the body portion BJ and the extension portions EX, the fixing pins SJ1 and SJ2 may move in spaced spaces of the grooves JH1 and JH2. Thus, the hinge unit HU may have an easily deformable shape while the hinge unit HU is repeatedly rolled and unrolled.

According to the embodiment, the extension portions EX may include a first extension portion EX1, a second extension portion EX2, a third extension portion EX3, . . . , a (n-1)-th extension portion EXn-1, and a n-th extension portion EXn.

The extension portions EX may have different widths in the second direction DR2. For example, the width of each of the extension portions EX may gradually decrease in a direction from the support portion SP to the additional support portion BP.

In the second direction DR2, the first extension portion EX1 has a first width W1. The second extension portion EX2 has a second width W2, and a third extension portion EX3 has a third width W3. The n-1-th extension portion EXn-1 has a (n-1)-th width Wn-1, and the n-th extension portion EXn has a n-th width Wn.

According to the embodiment, the width may gradually decrease from the first width W1 to the n-th width Wn. The decreasing width may decrease by an equal difference. For example, the decreasing rates or percentages of the first width W1 to the n-th width Wn may be substantially constant as moving in the second direction DR2. However, embodiments are not limited thereto.

Referring to FIG. 4C, in the rolled state, the first extension portion EX1 may overlap a ninth extension portion EX9, and a n-8-th extension portion EXn-8 may overlap the n-th extension portion EXn.

FIG. 1A is a block diagram representing the electronic device according to an embodiment. FIG. 5B is a plan view illustrating the housing according to an embodiment. In the block diagram of FIG. 5A, components of the electronic device EA will be described except for the housing CS and the hinge unit HU.

Figure 5A:
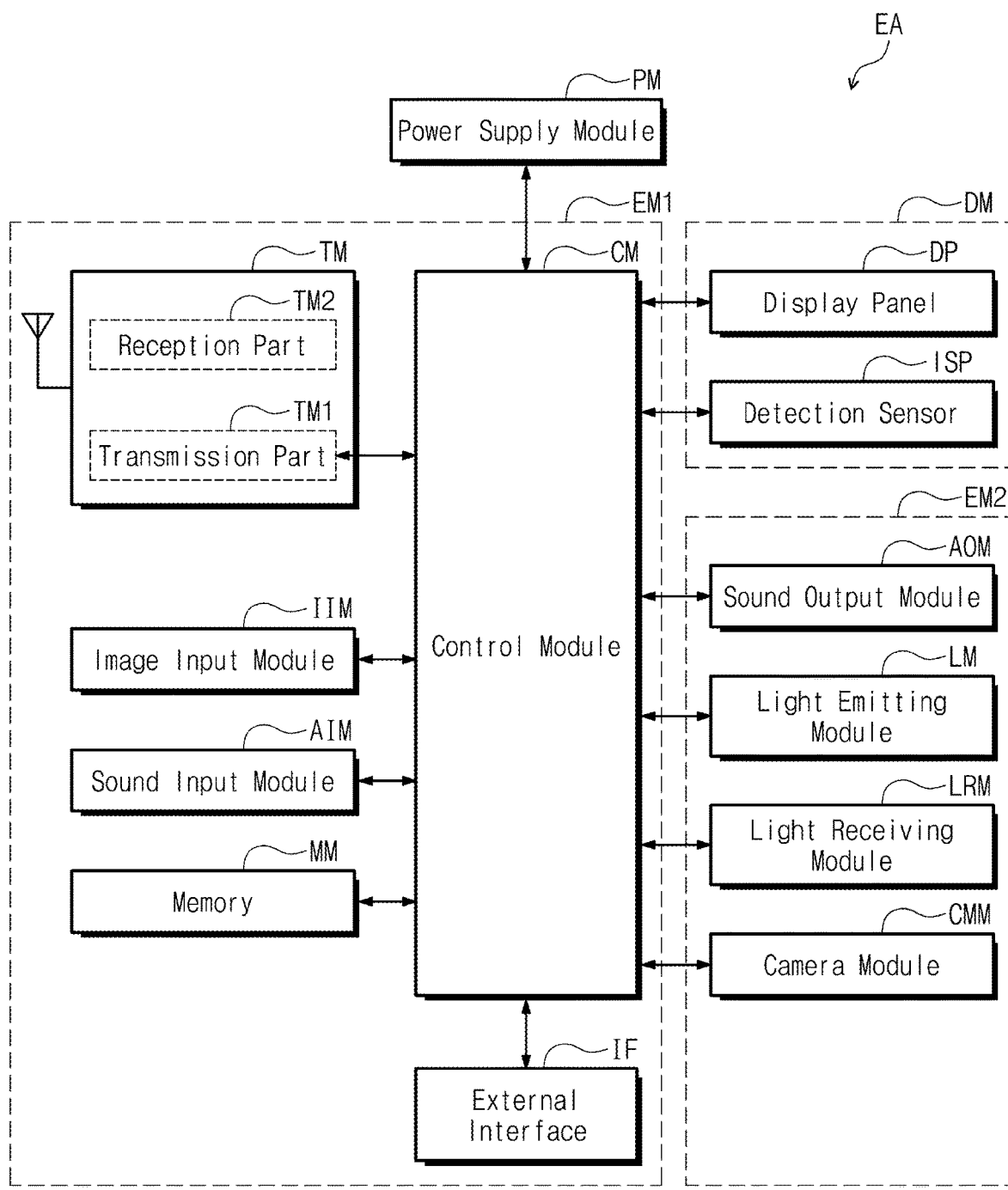
FIG. 5A is a block diagram of the electronic device FIG. 1A.
Figure 5B:
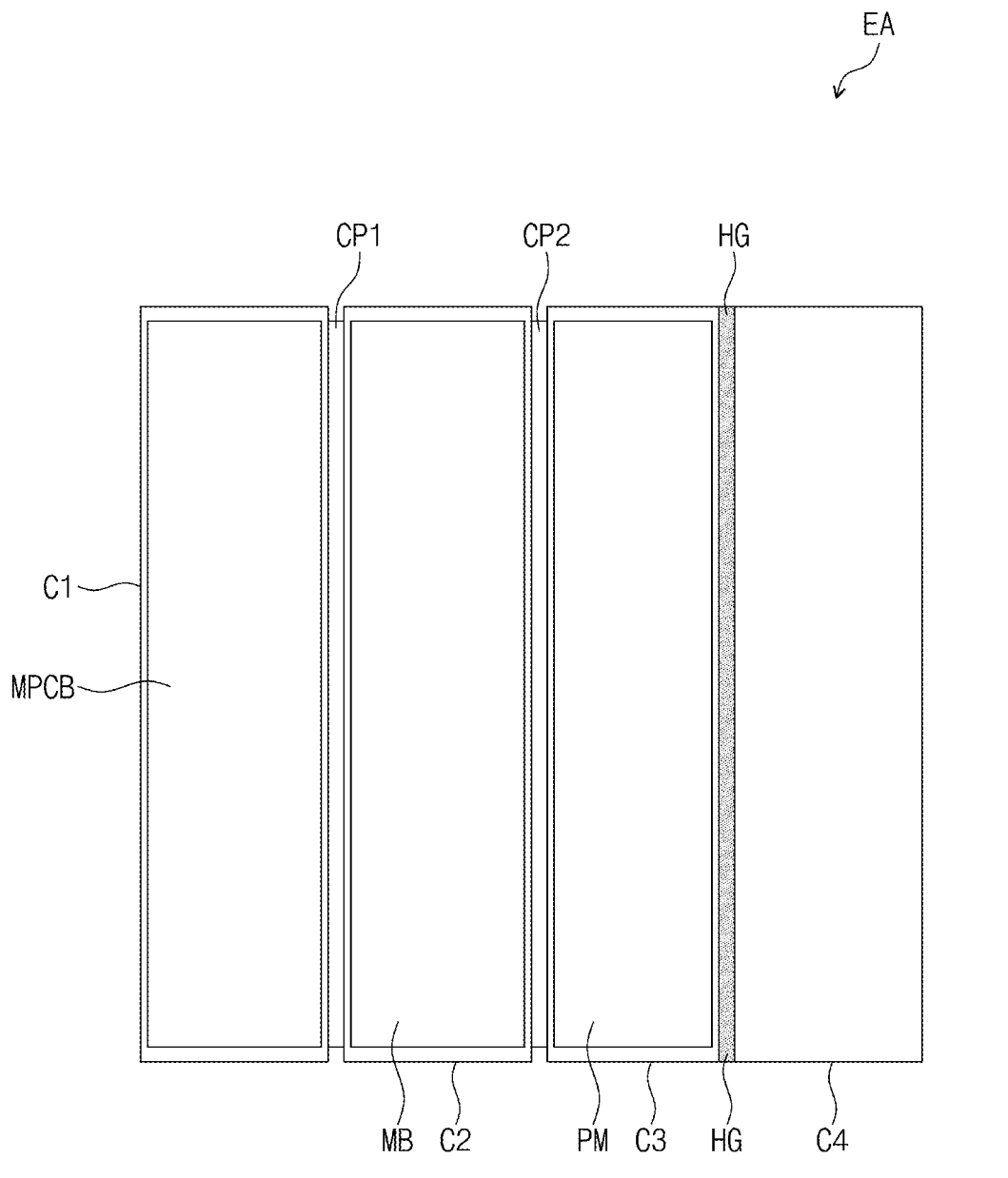
FIG. 5B is a plan view of a housing of the electronic device of FIG. 1C.

Referring to FIG. 5A, the electronic device EA according to an embodiment may include the above-described display module DM, a power supply module PM, and an electronic module EM. The electronic module EM may include a first electronic module EM1 and a second electronic module EM2. The display module DM, the power supply module PM, the first electronic module EM1, and the second electronic module EM2 may be electrically connected to each other.

The display module DM may include a display panel DP and a detection sensor ISP. The display panel DP may generate an image, and the detection sensor ISP may detect an external input.

The first electronic module EM1 and the second electronic module EM2 include various functional modules for operating the electronic device EA.

The first electronic module EM1 may include a control module CM, a wireless communication module TM, an image input module IIM, a sound input module AIM, a memory MM, and an external interface IF. The first electronic module EM1 may be directly mounted to the main board that is electrically connected to the display module DM or mounted to a separate board and electrically connected to the main board through a connector.

The control module CM may control an overall operation of the electronic device EA. The control module CM may be in the form of a microprocessor. For example, the control module CM activates or deactivates the display module DM. The control module CM may control other modules such as the image input module IIM or the sound input module AIM based on a touch signal received from the display module DM.

The wireless communication module TM may transmit or receive a wireless signal with another terminal by using Bluetooth or Wi-Fi link. The wireless communication module TM may use a general communication line to transmit or receive a voice signal. The wireless communication module TM includes a transmission portion TM1 for modulating a signal to be transmitted and transmitting the modulated signal and a reception portion TM2 for demodulating a received signal.

The image input module IIM processes an image signal to convert the image signal into image data that is displayable on the display module DM. The sound input module AIM receives an external sound signal through a microphone in a recording mode or a voice recognition mode to convert the received sound signal into electrical voice data.

The external interface module IF may be implemented as an interface connected to an external charger, a wire/wireless data port, or a card socket (e.g., a memory card and a SIM/UIM card).

The second electronic module EM2 may include a sound output module AOM, a light emitting module LM, a light receiving module LRM, and a camera module CMM. The above-described components may be directly mounted to the main board or mounted to a separate board and electrically connected to the display module DM or the first electronic module EM1 through a connector.

The sound output module AOM may convert sound data received from the wireless communication module TM or sound data stored in the memory MM to output the converted sound data to the outside.

The light emitting module LM may generate and output light. The light emitting module LM may output infrared light. For example, the light emitting module LM may include a LED element. For example, the light receiving module LRM may detect infrared light. The light receiving module LRM may be activated when infrared light having a predetermined level or more is detected. The light receiving module LRM may include a CMOS sensor. Infrared light generated from the light emitting module LM may be outputted and then reflected by an external object (e.g., a user's finger or face), and the reflected infrared light may be incident into the light receiving module LRM. The camera module CMM may photograph an external image.

The power supply module PM may provide power that is necessary for overall operations of the electronic device EA. The power supply module PM may include a typical battery module.

FIG. 5B is a view illustrating an arrangement relationship of components for driving the housing CS and the display module DM according to an embodiment.

The housing CS according to an embodiment may include a plurality of sidewall portions C1, C2, C3, and C4 and connection portions CP1, CP2, and HG. Each of the sidewall portions C1, C2, C3, and C4 may extend in the first direction DR1. The sidewall portions C1, C2, C3, and C4 may be coupled to each other or spaced apart from each other.

In at least one of the sidewall portions C1, C2, C3, and C4, an accommodation groove, in which components for driving the display module DM are disposed, may be defined.

For example, the accommodation groove, in which the main circuit board MPCB described in FIGS. 3A and 3B is accommodated, may be defined in the first sidewall portion C1. The accommodation groove, in which a main board MB is accommodated, may be defined in the second sidewall portion C2. On the main board MB, at least one of modules provided to the first electronic module EM1 and the second electronic module EM2 may be mounted. The accommodation groove, in which the power supply module PM is accommodated, may be defined in the third sidewall portion C3.

The main circuit board MPCB, the main board MB, and the power supply module PM may be electrically connected through lines.

The lines may pass through corresponding first and second connection portions CP1 and CP2 and connect the main circuit board MPCB, the main board MB, and the power supply module PM.

In the electronic device EA according to an embodiment, as the modules for driving the display module DM are disposed in the housing CS, a separate space for arranging the modules may be omitted. Thus, the slim electronic device EA having improved user convenience may be provided.

Figure 6A:
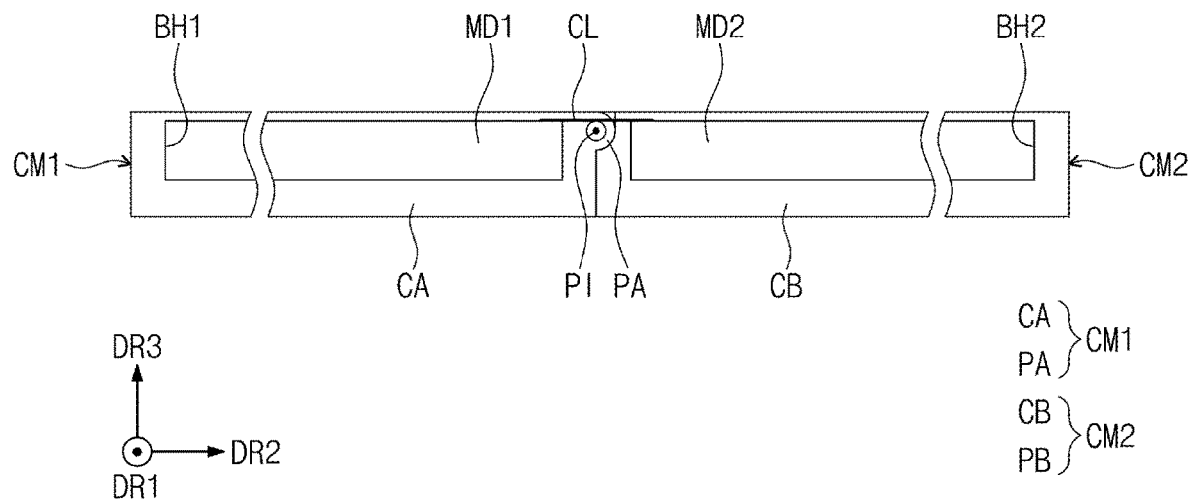
FIG. 6A is a cross-sectional view illustrating a coupling relationship of sidewall portions of the housing of FIG. 5B.
Figure 6B:
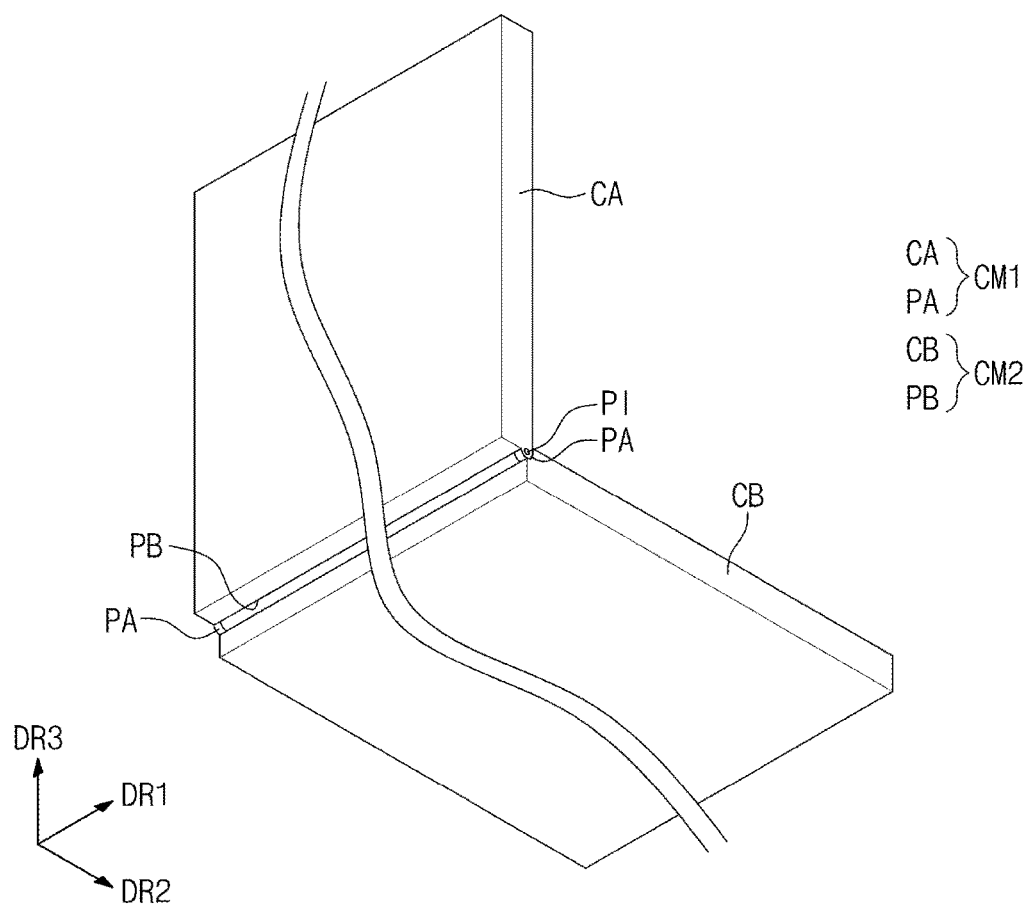
FIG. 6B is a perspective view illustrating the coupling relationship of the sidewall portions of the housing of FIG. 5B.
Figure 6C:
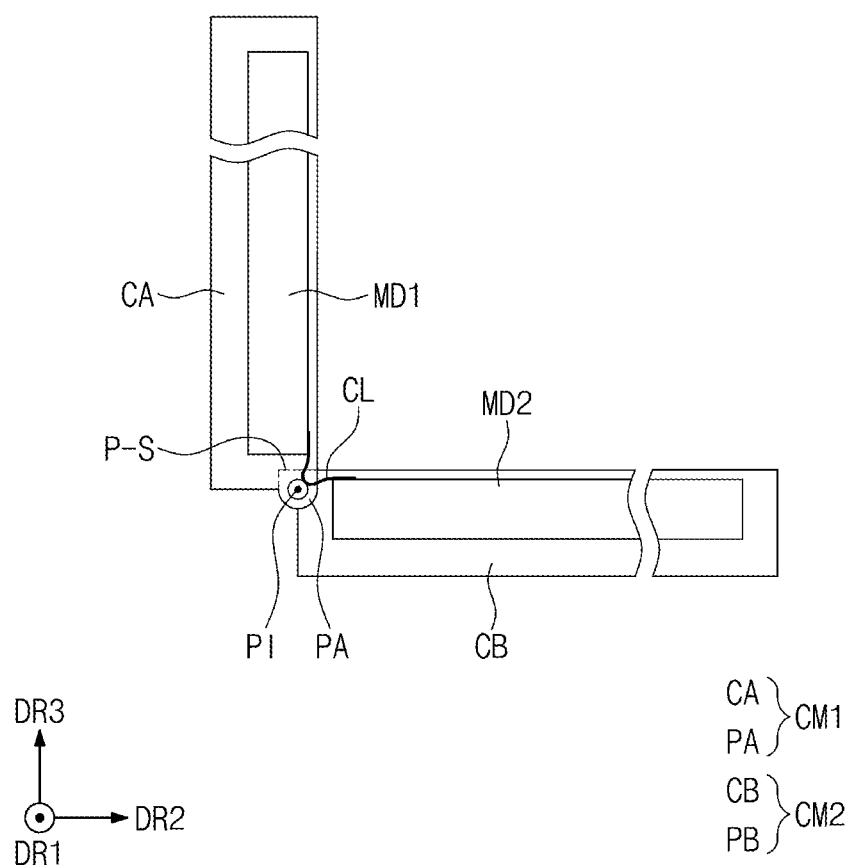
FIG. 6C is a cross-sectional view illustrating the coupling relationship of the sidewall portions of the housing of FIG. 5B.
Figure 7A:
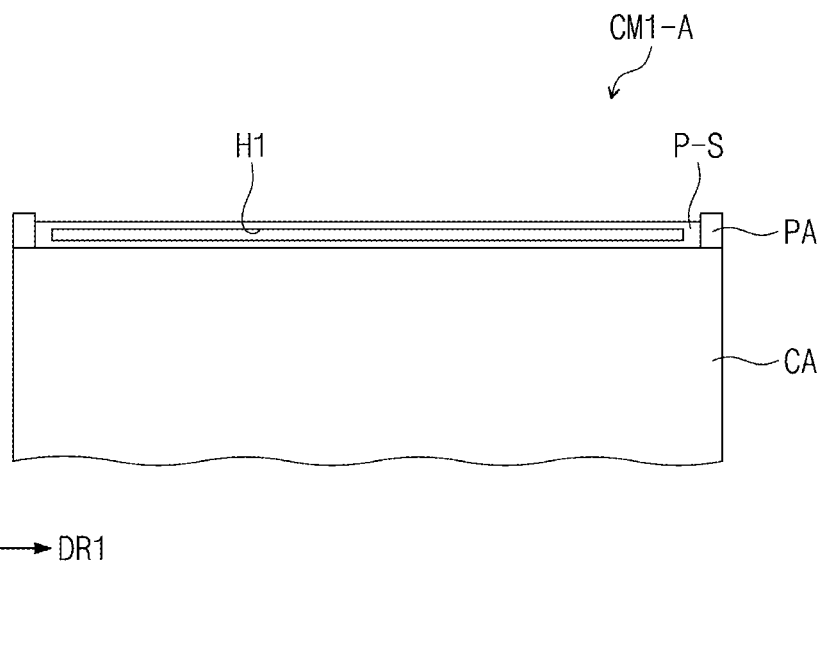
FIG. 7A is a plan view of an embodiment of one sidewall portion of the housing FIG. 5B.
Figure 7B:
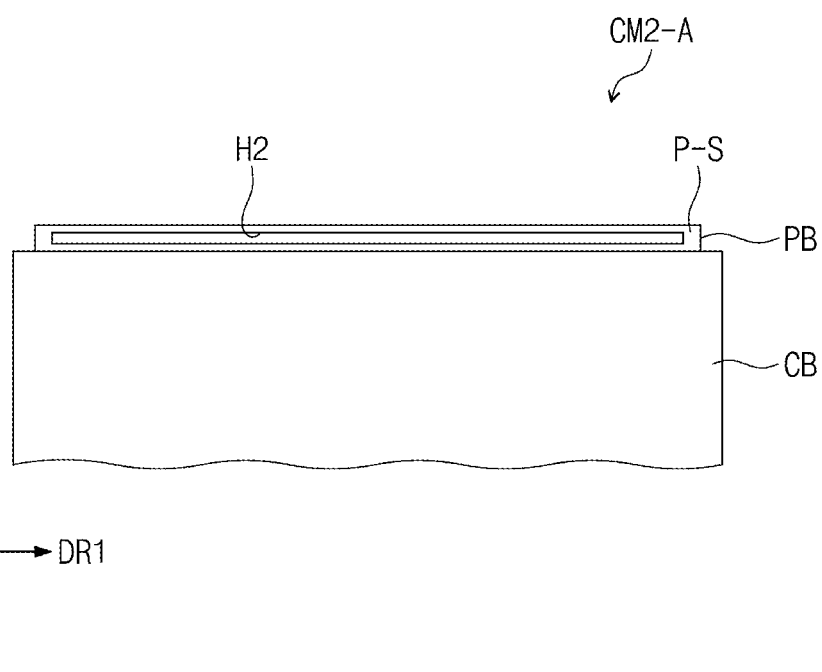
FIG. 7B is a plan view of an embodiment of another sidewall portion of the housing of FIG. 5B.
Figure 7C:
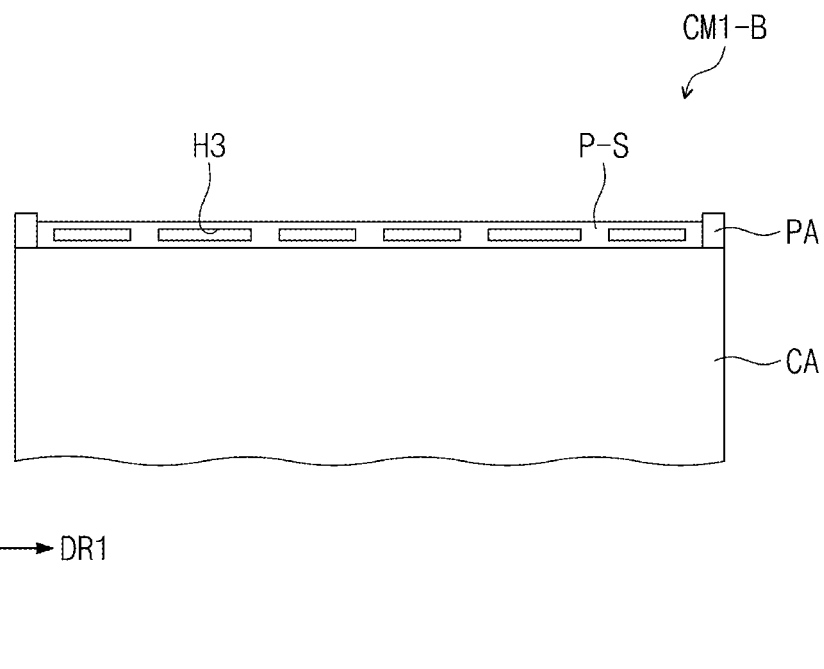
FIG. 7C is a plan view of another embodiment of one sidewall portion of the housing of FIG. 5B.
Figure 7D:
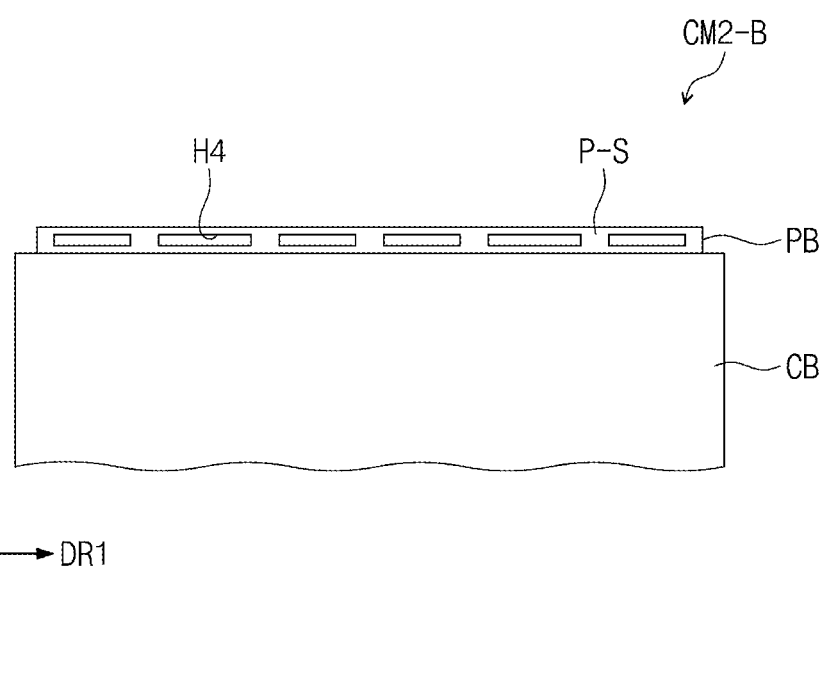
FIG. 7D is a plan view of another embodiment of another sidewall portion according to an embodiment of the inventive concept.

FIG. 6A is a cross-sectional view illustrating a coupling relationship of the sidewall portions according to an embodiment. FIG. 6B is a perspective view illustrating the coupling relationship of the sidewall portions according to an embodiment. FIG. 6C is a cross-sectional view illustrating the coupling relationship of the sidewall portions according to an embodiment. FIG. 7A is a plan view illustrating one sidewall portion according to an embodiment. FIG. 7B is a plan view illustrating another sidewall portion according to an embodiment. FIG. 7C is a plan view illustrating one sidewall portion according to an embodiment. FIG. 7D is a plan view illustrating another sidewall portion according to an embodiment.

Hereinafter, sidewall portions CA and CB to be described in FIGS. 6A, 6B, and 6C may be applied to the sidewall portions C1, C2, C3, and C4 described in FIGS. 1A, 1B, and 1C.

Referring to FIGS. 6A and 6B, the first sidewall portion CM1 may include a first body portion CA and coupling portions PA. In the first body portion CA, a first accommodation groove BH1 capable of accommodating a first module MD1 may be defined. The coupling portions PA may protrude from the first body portion CA and be spaced apart from each other in the first direction DR1.

The second sidewall portion CM2 may include a second body portion CB and a central portion PB. In the second body portion CB, a second accommodation groove BH2 capable of accommodating a second module MD2 may be defined. The central portion PB may protrude from the second body portion CB and extend in the second direction DR2. The central portion PB may be disposed between the coupling portions PA.

The coupling portions PA and the central portion PB may be aligned to each other in the second direction DR2 and coupled by a fixing pin PI passing through the coupling portions PA and the central portion PB.

The first module MD1 and the second module MD2 may be electrically connected by a line CL. The line CL may be connected through a connector provided in the first module MD1 and the second module MD2.

According to an embodiment, the line CL for connecting the first module MD1 and the second module MD2 may be connected to one end of each of the first module MD1 and the second module MD2 through a line groove defined in a contact surface P-S at which a first body portion CA contacts the central portion PB.

The first module MD1 and the second module MD2 may be one of the main circuit board MPCB, the main board MB, and the power supply module PM, which are described in FIG. 5B.

Referring to FIGS. 7A and 7B, a first sidewall portion CM1-A according to an embodiment may include a first body portion CA and coupling portions PA. The coupling portions PA may protrude from the first body portion CA and be spaced apart from each other in the second direction DR2. According to the embodiment, a first line groove H1 may be defined in a contact surface P-S of the first body portion CA.

A second sidewall portion CM2-A may include a second body portion CB and a central portion PB. The central portion PB may protrude from the second body portion CB and extend in the second direction DR2. The central portion PB may be disposed between the coupling portions PA. According to the embodiment, a second line groove H2 may be defined in a contact surface P-S of the central portion PB.

Each of the contact surface P-S of the first body portion CA and the contact surface P-S of the central portion PB may be defined as a surface at which the first sidewall portion CM1-A and the second sidewall portion CM2-B contact each other when coupled by the fixing pin PI.

Each of the line grooves H1 and H2 according to the embodiment may be provided as one hole extending in the second direction DR2.

According to the embodiment, although modules for driving the display unit DU are disposed in the first sidewall portion CM1-A and the second sidewall portion CM2-B, as the line grooves H1 and H2 through which the line CL passes are provided, the electronic device EA in which the modules are easily electrically connected may be provided.

Referring to FIGS. 7C and 7D, a first sidewall portion CM1-B according to an embodiment may include a first body portion CA and coupling portions PA. The coupling portions PA may protrude from the first body portion CA and be spaced apart from each other in the second direction DR2. According to the embodiment, a plurality of third line grooves H3 may be defined in a contact surface P-S of the first body portion CA.

A second sidewall portion CM2-B may include a second body portion CB and a central portion PB. The central portion PB may protrude from the second body portion CB and extend in the second direction DR2. The central portion PB may be disposed between the coupling portions PA. According to the embodiment, a plurality of fourth line grooves H4 may be defined in a contact surface P-S of the central portion PB.

The line grooves H3 and H4 may each extend in the second direction DR2 and be spaced apart from each other in the second direction DR2.

Each of the third line grooves H3 may overlap the corresponding fourth line groove among the fourth line grooves H4. Thus, although the line CL for connecting the modules is provided in plurality, the lines CL may be disposed in the sidewall portions CM1-B and CM2-B.

Figure 8A:
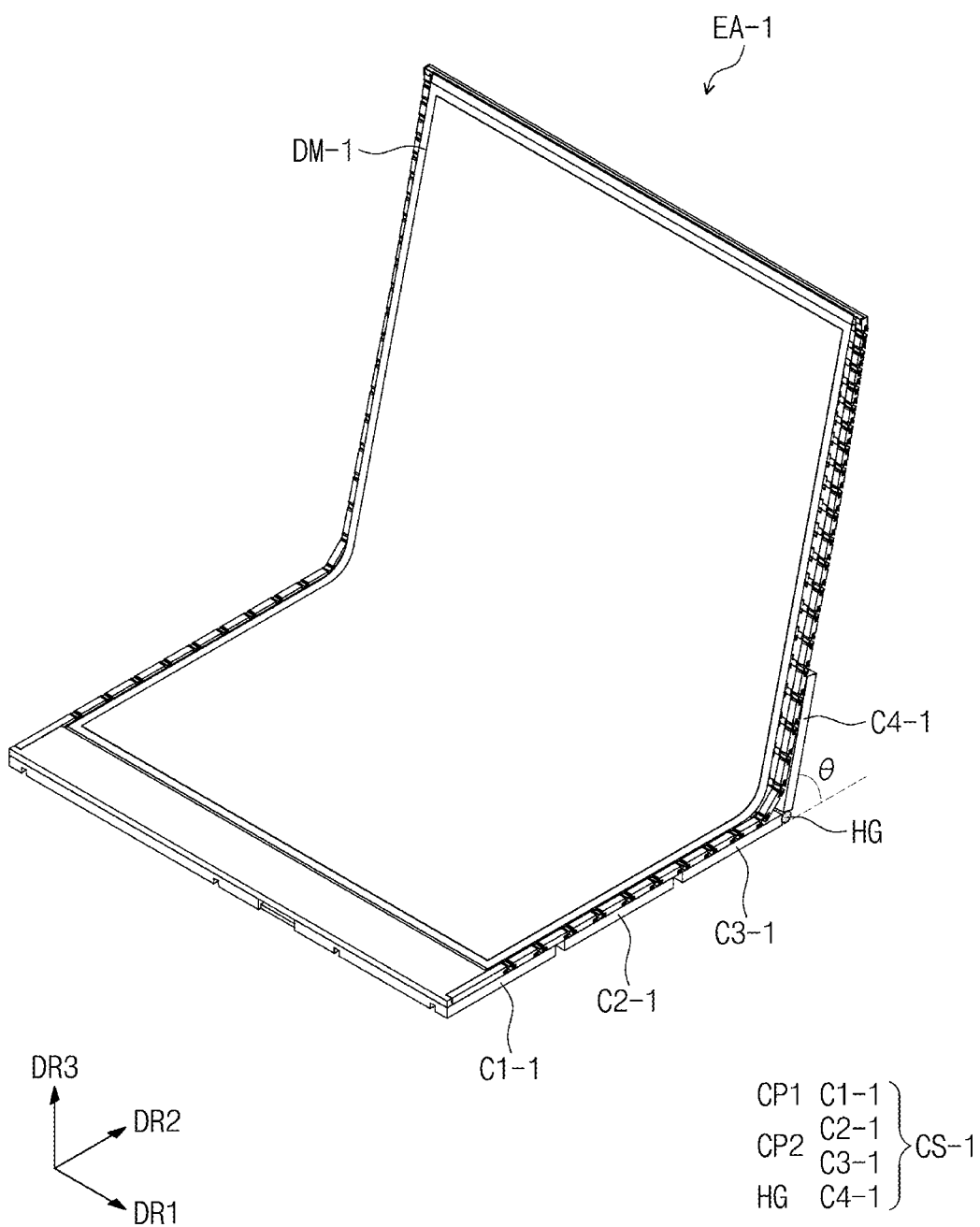
FIGS. 8A and 8B are perspective views of another embodiment of the electronic device of FIG. 1A.
Figure 8B:
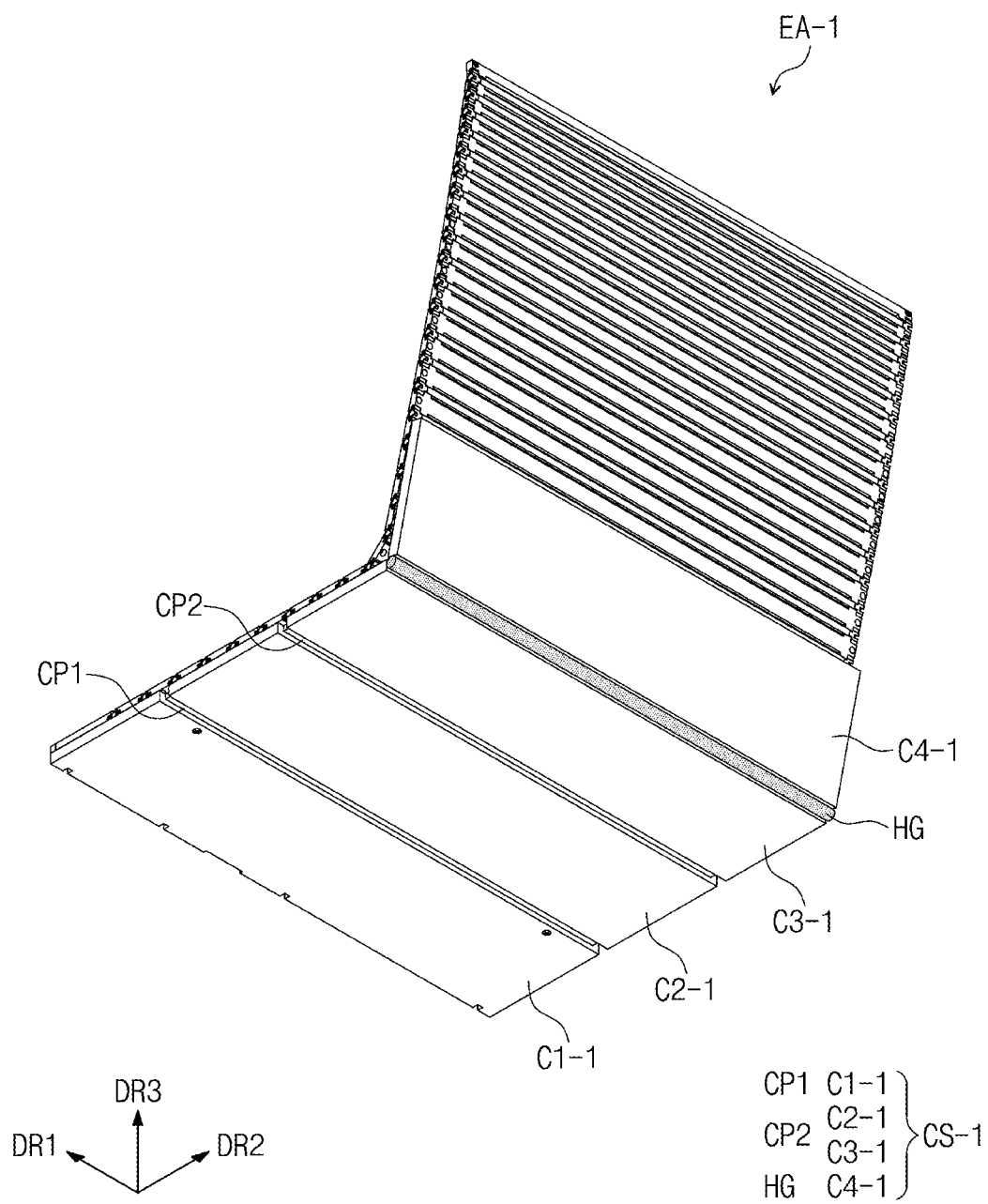

FIGS. 8A and 8B are perspective views illustrating an electronic device in one state according to an embodiment. The same or similar components as those described in FIGS. 1A to 7B will be designated by the same or similar reference numerals, respectively, and overlapped descriptions thereof will be omitted for descriptive convenience.

Referring to FIGS. 8A and 8B, an electronic device EA-1 according to an embodiment may include a display module DM-1 and a housing CS-1.

The housing CS-1 may include a plurality of sidewall portions C1-1, C2-1, C3-1, and C4-1 and connection portions CP1, CP2, and HG. The sidewall portions C1-1, C2-1, C3-1, and C4-1 may each extend in the first direction DR1 and be spaced apart from each other in the second direction DR2.

According to the embodiment, in a state in which the housing CS-1 and the display module DM-1 are opened, a third connection portion HG may fix an angle θ between a third sidewall portion C3-1 and a fourth sidewall portion C4-1 to be a predetermined angle. For example, the angle θ between the third sidewall portion C3-1 and the fourth sidewall portion C4-1 may be about 90° or more to about 180° or less.

According to the embodiment, the housing CS-1 capable of deforming and holding a shape of the display module DM-1 to have an angle appropriate to a purpose of a user even in a state in which the display module DM-1 and the housing CS-1 are opened may be provided. Thus, the electronic device EA-1 having improved user convenience may be provided.

Figure 9:
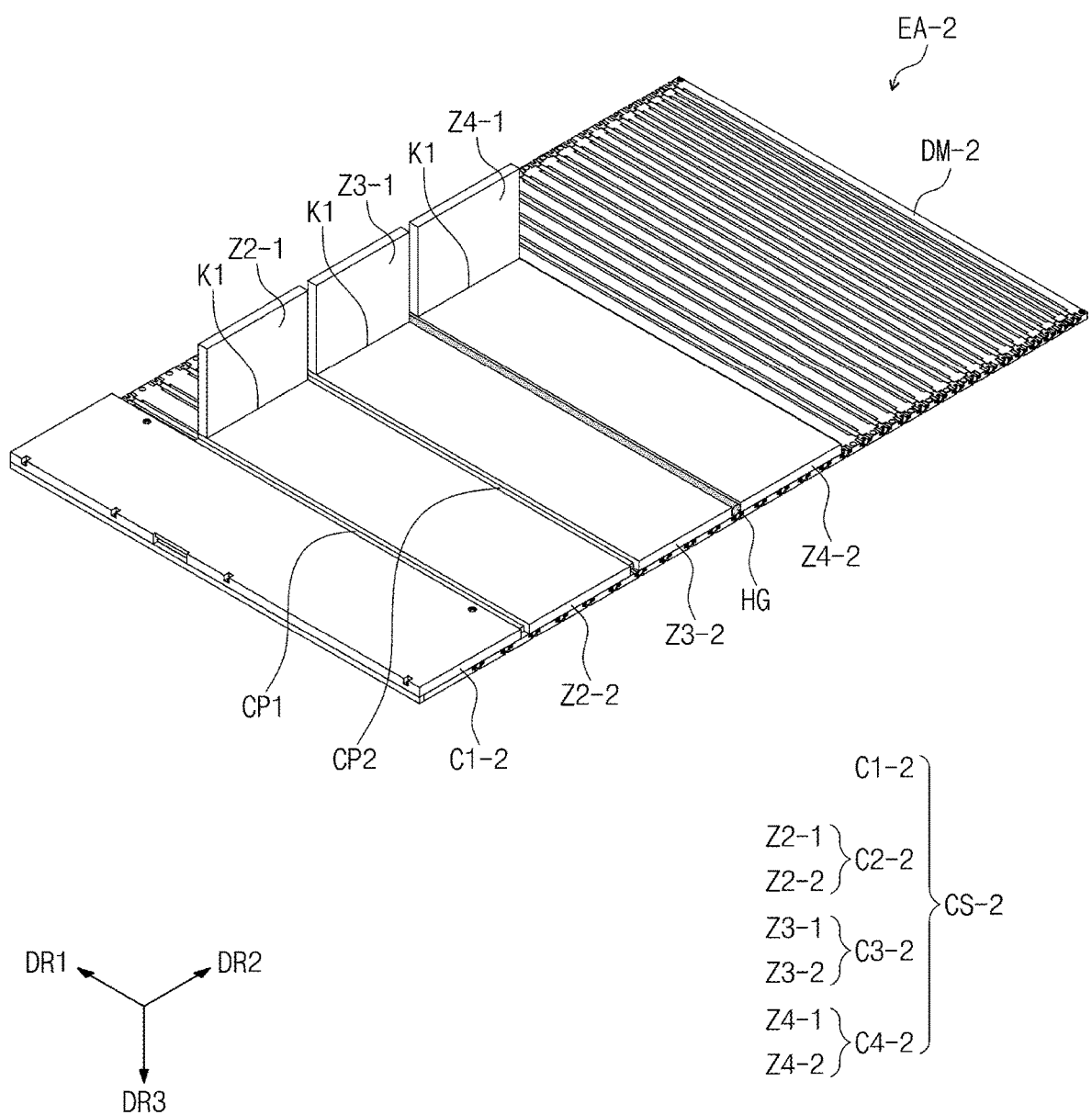
FIG. 9 is a perspective view of another embodiment of the electronic device of FIG. 1A.

FIG. 9 is a perspective view illustrating an electronic device according to an embodiment. The same or similar components as those described in FIGS. 1A to 7B will be designated by the same or similar reference numerals, respectively, and overlapped descriptions thereof will be omitted for descriptive convenience.

Referring to FIG. 9, an electronic device EA-2 according to an embodiment may include a display module DM-2 and a housing CS-2.

The housing CS-2 may include a plurality of sidewall portions C1-2, C2-2, C3-2, and C4-2 and connection portions CP1, CP2, and HG. The sidewall portions C1-2, C2-2, C3-2, and C4-2 may each extend in the first direction DR1 and be spaced apart from each other in the second direction DR2.

A second sidewall portion C2-2 may include a second holding portion Z2-1 and a second base portion Z2-2. The second holding portion Z2-1 may be bent in a direction from the display module DM-2 to the second base portion Z2-2 by using a first bending line K1 extending in the second direction DR2 as a boundary.

A third sidewall portion C3-2 may include a third holding portion Z3-1 and a third base portion Z3-2. The third holding portion Z3-1 may be bent in a direction from the display module DM-2 to the third base portion Z3-2 by using a first bending line K1 extending in the second direction DR2 as a boundary.

A fourth sidewall portion C4-2 may include a fourth holding portion Z4-1 and a fourth base portion Z4-2. The fourth holding portion Z4-1 may be bent in a direction from the display module DM-2 to the fourth base portion Z4-2 by using the first bending line K1 extending in the second direction DR2 as a boundary.

An angle between each of the holding portions Z2-1, Z3-1, and Z4-1 and each of corresponding base portions Z2-2, Z3-2, and Z4-2 may be about 90° or more to about 180° or less.

According to the embodiment, the electronic device EA-2 that is easily held even in a state in which the display module DM-2 is unrolled may be provided.

Figure 10A:
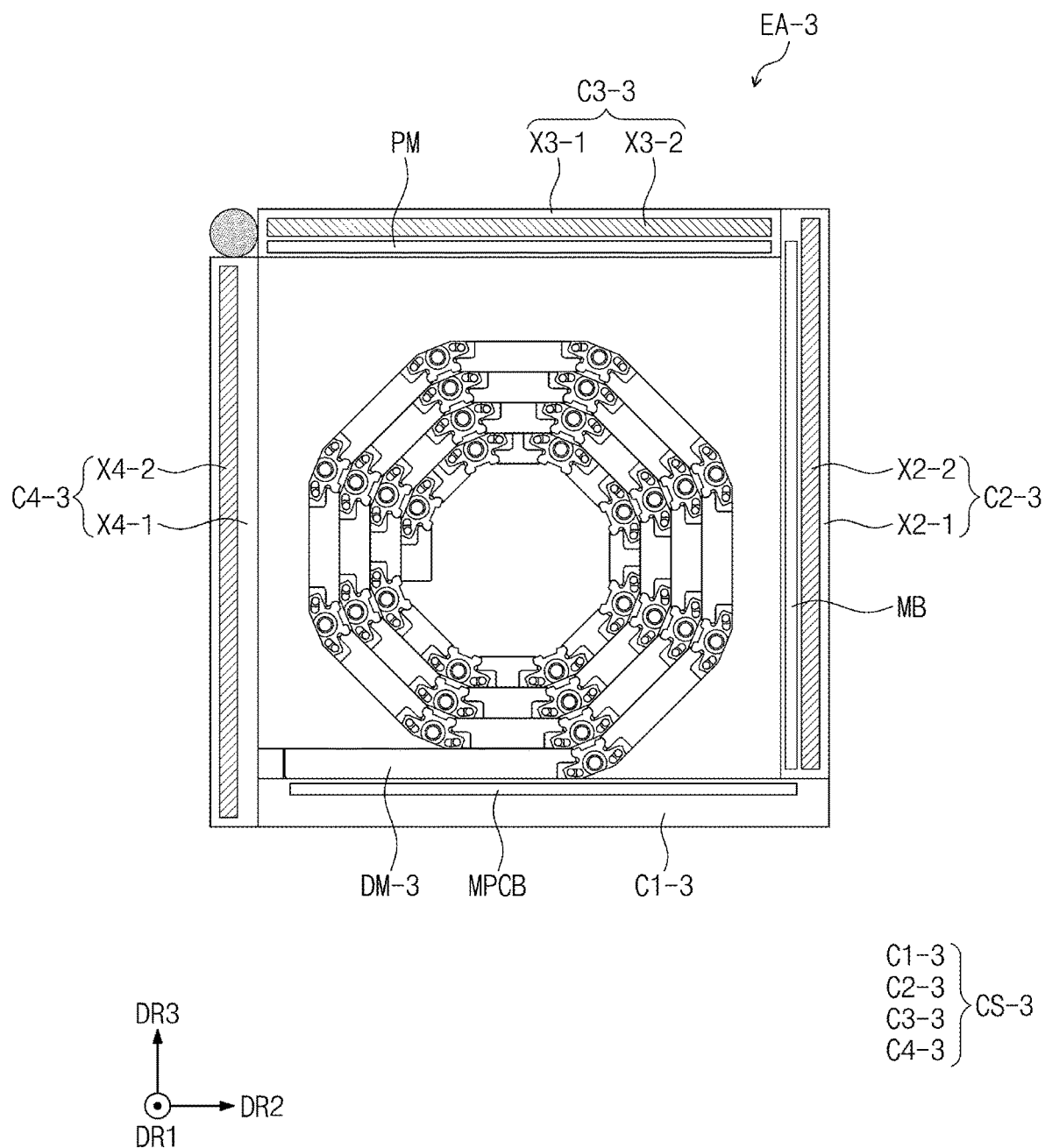
FIG. 10A is a side view of the electronic device of FIG. 1A.
Figure 10B:
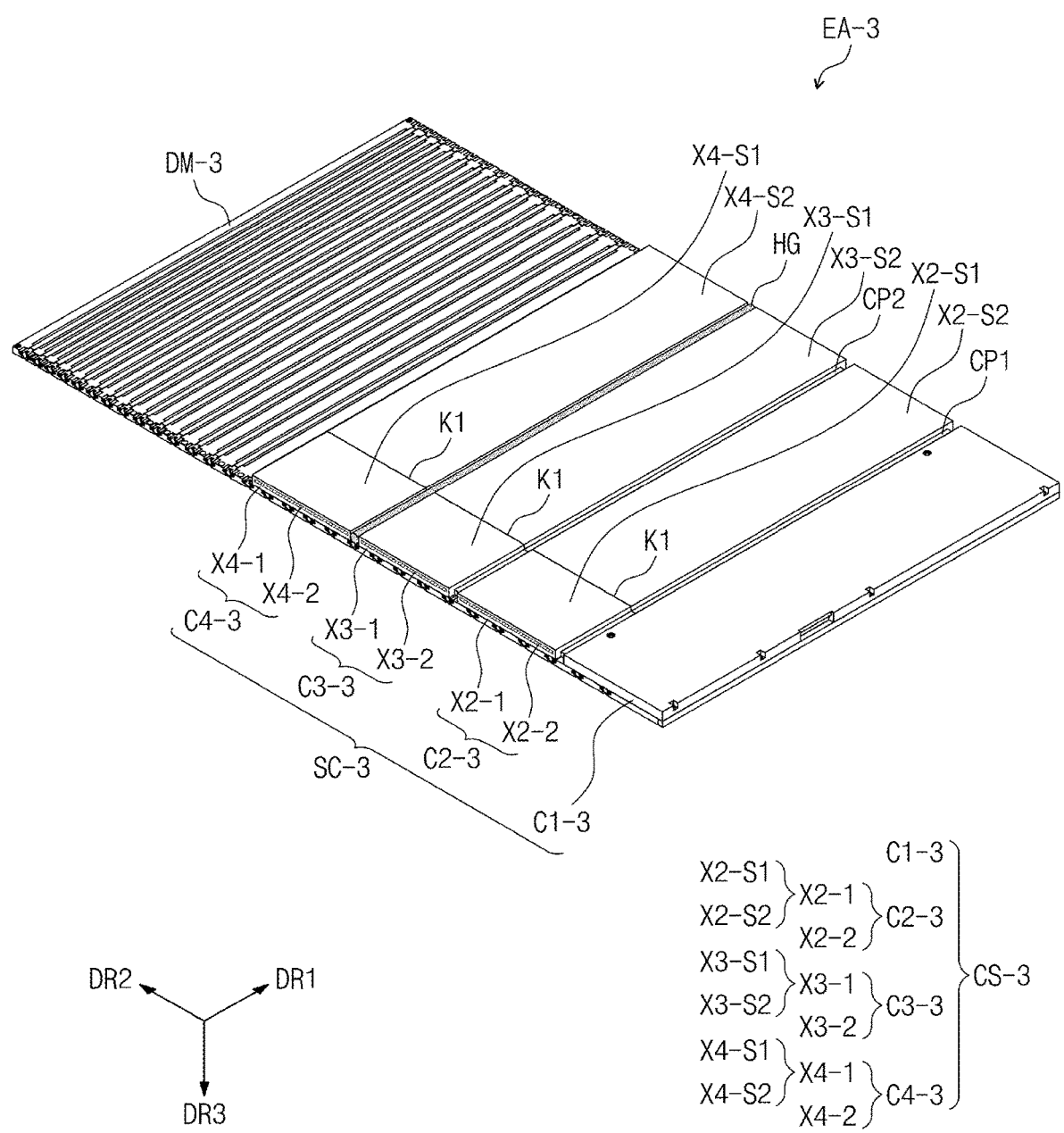
FIGS. 10B, 10C, 10D, and 10E are perspective views illustrating one state of the electronic device in FIG. 10A.
Figure 10C:
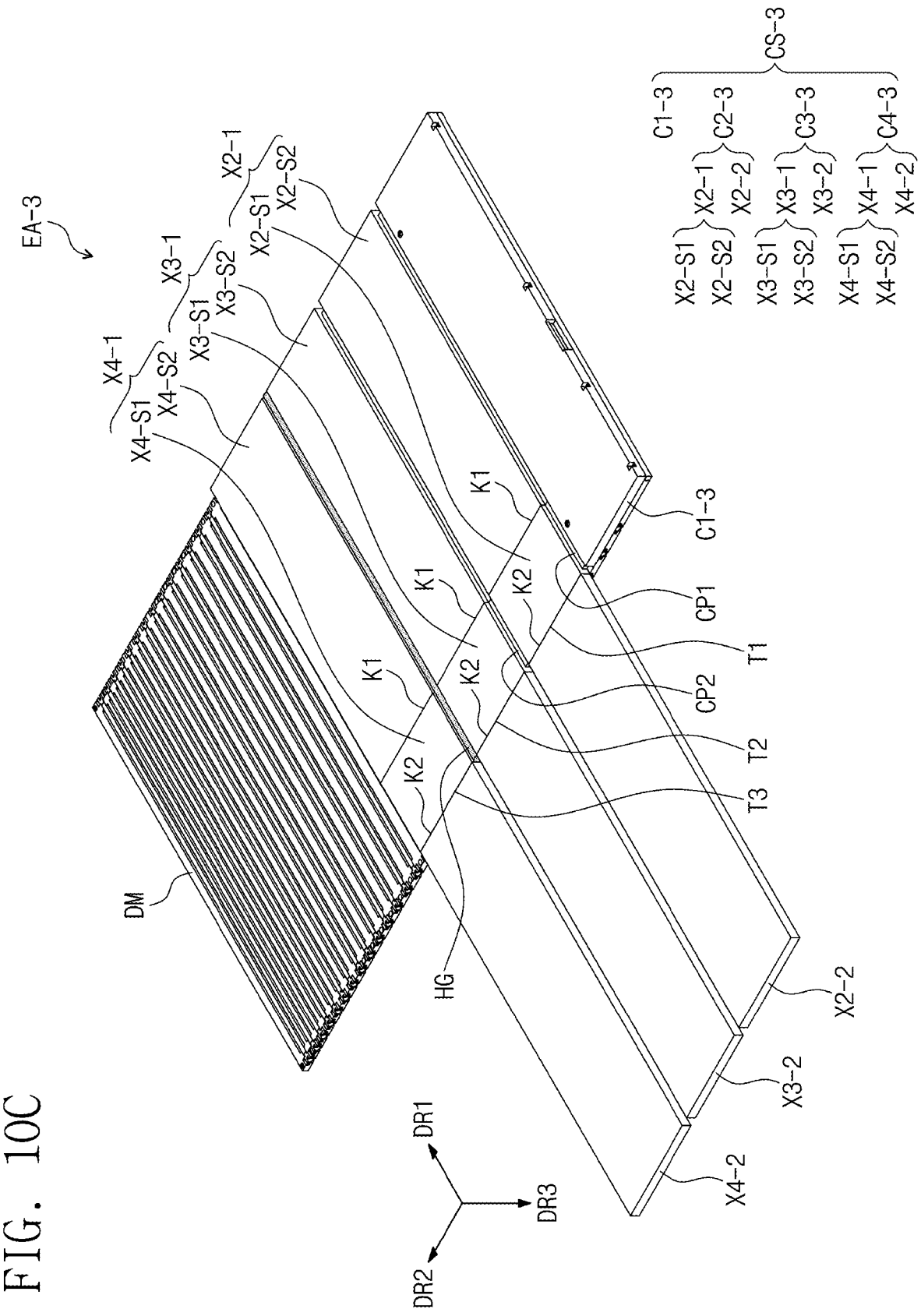

FIG. 10A is a side view illustrating an electronic device according to an embodiment. FIGS. 10B to 10E are perspective views illustrating one state of the electronic device in FIG. 10A. The same or similar components as those described in FIGS. 1A to 7B will be designated by the same or similar reference numerals, respectively, and overlapped descriptions thereof will be omitted for descriptive convenience.

Referring to FIGS. 10A, 10B, 10C, 10D, and 10E, an electronic device EA-3 according to an embodiment may include a display module DM-3 and a housing CS-3. FIG. 10A illustrates a state in which the display module DM-3 is disposed in the housing CS-3, and FIGS. 10B, 10C, 10D, and 10E illustrate the unrolled display module DM-3.

The housing CS-3 may include a plurality of sidewall portions C1-3, C2-3, C3-3, and C4-3 and connection portions CP1, CP2, and HG. The sidewall portions C1-3, C2-3, C3-3, and C4-3 may each extend in the first direction DR1 and be spaced apart from each other in the second direction DR2.

A second sidewall portion C2-3 may include a second main sidewall portion X2-1 and a second additional sidewall portion X2-2. The second additional sidewall portion X2-2 may be disposed in an accommodation groove defined in the second main sidewall portion X2-1 in a first mode, and slide from the second main sidewall portion X2-1 to protrude to the outside in a second mode. The second additional sidewall portion X2-2 may be disposed without interference with a main board MB disposed in the second main sidewall portion X2-1 in the first mode.

The second main sidewall portion X2-1 may include a second holding portion X2-S1 and a second base portion X2-S2. The second holding portion X2-S1 may be bent from the second base portion X2-S2 by using a first bending line K1 extending in the second direction DR2 as a boundary in the second mode.

A third sidewall portion C3-3 may include a third main sidewall portion X3-1 and a third additional sidewall portion X3-2. The third additional sidewall portion X3-2 may be disposed in an accommodation groove defined in the third main sidewall portion X3-1 in the first mode, and slide from the third main sidewall portion X3-1 to protrude to the outside in the second mode. The third additional sidewall portion X3-2 may be disposed without interference with a power supply module PM disposed in the third main sidewall portion X3-1 in the first mode.

The third main sidewall portion X3-1 may include a third holding portion X3-S1 and a third base portion X3-S2. The third holding portion X3-S1 may be bent from the third base portion X3-S2 by using the first bending line K1 extending in the second direction DR2 as a boundary in the second mode.

A fourth sidewall portion C4-3 may include a fourth main sidewall portion X4-1 and a fourth additional sidewall portion X4-2. The fourth additional sidewall portion X4-2 may be disposed in an accommodation groove defined in the fourth main sidewall portion X4-1 in the first mode, and slide from the fourth main sidewall portion X4-1 to protrude to the outside in the second mode.

The fourth main sidewall portion X4-1 may include a fourth holding portion X4-S1 and a fourth base portion X4-S2. The fourth holding portion X4-S1 may be bent from the fourth base portion X4-S2 by using the first bending line K1 extending in the second direction DR2 as a boundary in the second mode.

In the second mode, i.e., a state in which each of the additional sidewall portions X2-2, X3-2, and X4-2 is slid from the accommodation groove of each of the main sidewall portions X2-1, X3-1, and X4-1, the additional sidewall portions X2-2, X3-2, and X4-2 may be bent from the corresponding holding portions X2-S1, X3-S1, and X4-S1 by using a second bending line K2 as a boundary.

The second bending line K2 may be spaced apart from the first bending line K1 in the first direction DR1 and extend in the second direction DR2.

Figure 10D:
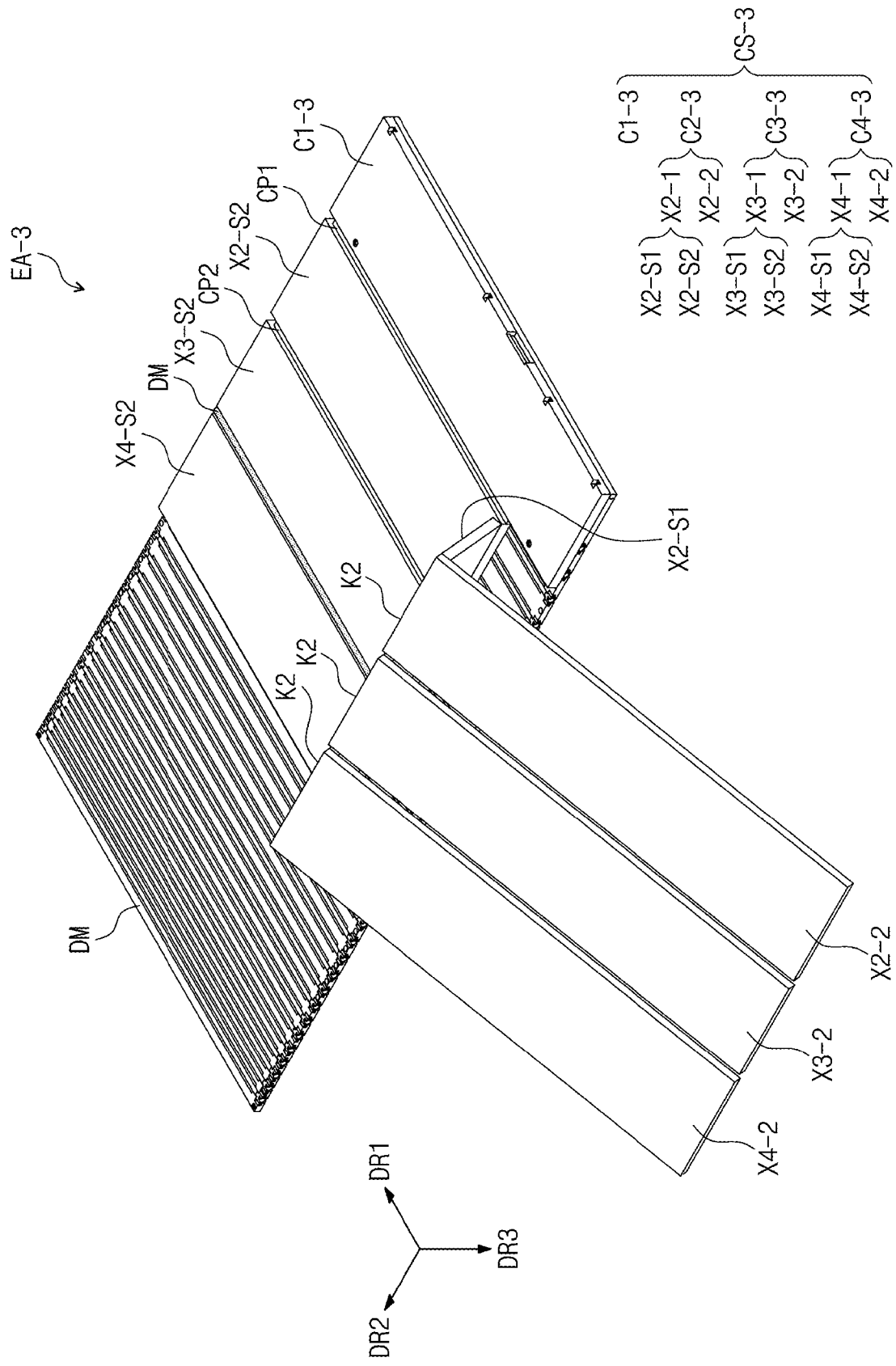

FIG. 10D illustrates one state in which the holding portions X2-S1, X3-S1, and X4-S1 are bent from the base portions X2-S2, X3-S2, and X4-S2 with reference to the first bending line K1, and the additional sidewall portions X2-2, X3-2, and X4-2 are bent from the holding portions X2-S1, X3-S1, and X4-S1 with reference to the second bending line K2.

Figure 10E:
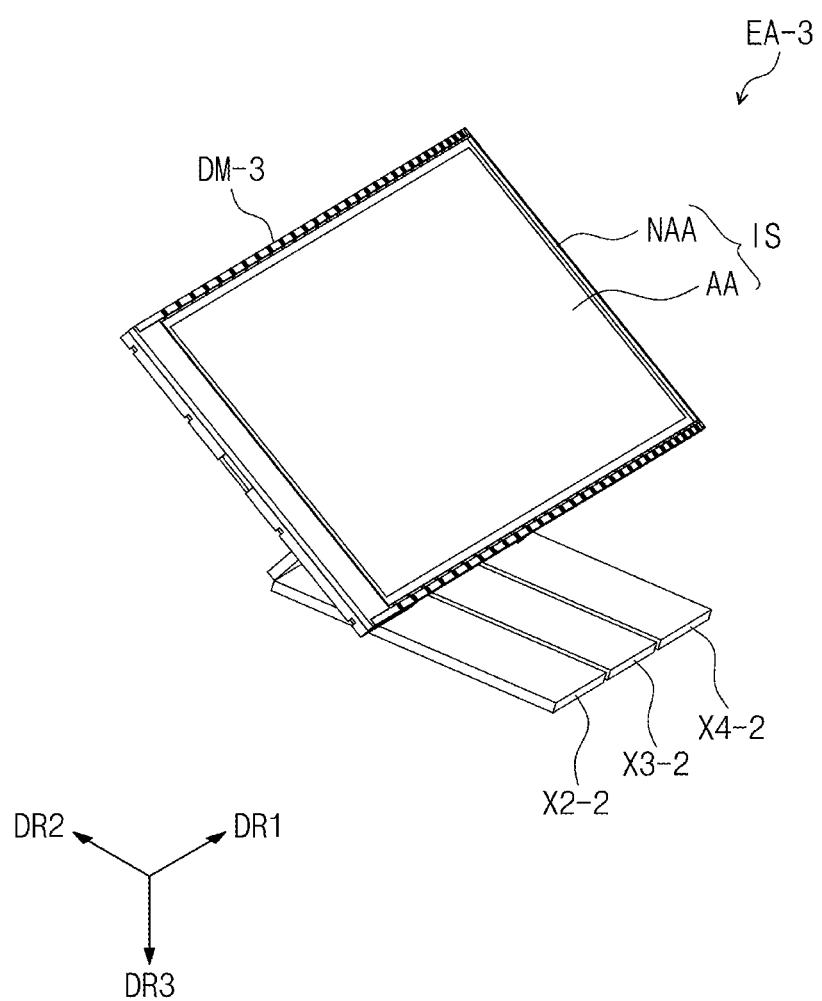

Referring to FIG. 10E, a portion of each of the additional sidewall portions X2-2, X3-2, and X4-2 may be bent in a direction toward the display surface IS of the display module DM-3 in a state of being completely bent from the holding portions X2-S1, X3-S1, and X4-S1 to hold the display module DM-3. Thus, the unrolled display module DM-3 may be held in the air through the housing CS-3. Therefore, the electronic device EA-3 having improved user convenience may be provided.

In the electronic device according to an embodiment, as the modules for driving the display module are disposed in the housing, the separate space for arranging the modules may be omitted. Thus, the slim electronic device having the improved usability may be provided.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An electronic device comprising:
    a display module comprising a display unit and a hinge unit coupled to the display unit and configured to be rolled with display unit, the display unit comprising a display panel, a flexible circuit board connected to the display panel, and a main circuit board connected to the flexible circuit board; and
    a housing comprising sidewall portions each extending in a first direction,
    wherein at least one of the sidewall portions comprises an accommodation groove to which the main circuit board is inserted, and
    wherein the sidewall portions are deformable to have a closed state of surrounding the display module and an opened state of exposing at least a portion of the display module outside of the housing.

2. The electronic device of claim 1, further comprising:
    a main board connected to the main circuit board;
    a power supply module connected to the main circuit board; and
    lines for connecting the main circuit board to the main board and for connecting the main board to the power supply module,
    wherein at least one of the main board and the power supply module is inserted to the accommodation groove of the sidewall portions.

3. The electronic device of claim 2, wherein the sidewall portions comprise a first sidewall portion, a second sidewall portion, a third sidewall portion, and a fourth sidewall portion, each arranged in a second direction intersecting the first direction in the opened state, and
    the housing comprises:
    a first connection portion disposed between the first sidewall portion and the second sidewall portion;
    a second connection portion disposed between the second sidewall portion and the third sidewall portion; and
    a third connection portion disposed between the third sidewall portion and the fourth sidewall portion,
    wherein each of the first connection portion and the second connection portion comprises a line groove through which a corresponding line of the lines passes.

4. The electronic device of claim 3, wherein the display module is rolled in the second direction,
    the first, second, third, and fourth sidewall portions are deformed from the closed state to the opened state in the second direction, and
    one portion of the first sidewall portion contacts one portion of the fourth sidewall portion in the closed state.

5. The electronic device of claim 3, wherein the third connection portion maintains an angle between the third sidewall portion and the fourth sidewall portion at a predetermined angle in a range from about 90° to about 180°.

6. The electronic device of claim 3, wherein at least one of the second, third, and fourth sidewall portions comprises a base portion and a holding portion, which are arranged in the first direction by using a first bending line extending in the second direction as a boundary, and
    the holding portion is bent along the first bending line so that an angle with the base portion is maintained at a predetermined angle in a range from about 90° to about 180°.

7. The electronic device of claim 6, wherein each of the second, third, and fourth sidewall portions further comprises an additional sidewall portion inserted into the accommodation groove in a first mode and slid outside of the housing in a second mode,
    wherein the additional sidewall portion is bent from the holding portion by using a second bending line spaced apart from the first bending line in the first direction and extending in the second direction as a boundary.

8. The electronic device of claim 2, wherein one of the sidewall portions comprises a central portion protruding from the one of the sidewall portions and extending in the first direction, the central portion comprising a line groove through which a corresponding line of the lines passes, and
    another of the sidewall portions comprises coupling portions protruding from the another of the sidewall portions and spaced apart from each other in the first direction with the central portion therebetween, the coupling portions being coupled to the central portion.

9. The electronic device of claim 8, wherein the line groove is provided in plurality and spaced apart from each other in the first direction.

10. The electronic device of claim 1, wherein the flexible circuit board is bent with the hinge unit therebetween, and
    the display panel and the main circuit board are spaced apart from each other with the hinge unit therebetween.

11. The electronic device of claim 1, wherein the hinge unit comprises:
    extension portions each extending in the first direction and arranged in a second direction intersecting the first direction; and
    joint portions each disposed between two adjacent extension portions, wherein the extension portions have widths that gradually decrease in a direction away from the flexible circuit board in the second direction.

12. The electronic device of claim 11, wherein the hinge unit further comprises:
   a support portion connected to an extension portion, which is closest to the flexible circuit board among the extension portions, through the joint portions; and
   a cover portion coupled to the support portion to cover a portion of each of the display panel and the flexible circuit board,
   wherein the flexible circuit board is bent with the support portion therebetween.

13. The electronic device of claim 11, wherein among the extension portions, a n-th extension portion and a (n+8)-th extension portion overlap each other in a state in which the display module is rolled, where, the 'n' is a natural number equal to or greater than 1.

* * * * *